(12) United States Patent
Kim et al.

(10) Patent No.: US 8,654,579 B2
(45) Date of Patent: Feb. 18, 2014

(54) NON-VOLATILE MEMORY DEVICE AND METHOD OF MANUFACTURING THE SAME

(75) Inventors: Beom Yong Kim, Gyeonggi-do (KR); Kwon Hong, Gyeonggi-do (KR); Kee Jeung Lee, Seoul (KR); Ki Hong Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 204 days.

(21) Appl. No.: 13/298,591

(22) Filed: Nov. 17, 2011

(65) Prior Publication Data

US 2012/0126308 A1 May 24, 2012

(30) Foreign Application Priority Data

Nov. 19, 2010 (KR) .................. 10-2010-0115592

(51) Int. Cl.
*G11C 11/40* (2006.01)
*H01L 29/792* (2006.01)

(52) U.S. Cl.
USPC ..... 365/184; 257/314; 257/392; 257/E29.309

(58) Field of Classification Search
USPC ............... 257/314, 392, E29.309; 365/184
See application file for complete search history.

(56) References Cited

U.S. PATENT DOCUMENTS

| 2009/0321816 | A1* | 12/2009 | Son et al. ................. 257/326 |
| 2010/0112769 | A1* | 5/2010 | Son et al. ................. 438/261 |
| 2010/0258852 | A1* | 10/2010 | Lim et al. ................. 257/324 |
| 2011/0013458 | A1* | 1/2011 | Seol .................... 365/185.18 |
| 2011/0018051 | A1* | 1/2011 | Kim et al. ................. 257/324 |
| 2011/0062510 | A1* | 3/2011 | Joo ..................... 257/324 |
| 2011/0073866 | A1* | 3/2011 | Kim et al. ................. 257/69 |
| 2011/0199813 | A1* | 8/2011 | Yoo et al. ................. 365/148 |
| 2012/0119283 | A1* | 5/2012 | Lee et al. ................. 257/316 |
| 2012/0292686 | A1* | 11/2012 | Son et al. ................. 257/316 |
| 2012/0300547 | A1* | 11/2012 | Choi .................... 365/185.05 |
| 2013/0069137 | A1* | 3/2013 | Pekny ................... 257/319 |
| 2013/0107602 | A1* | 5/2013 | Oh et al. ................. 365/51 |
| 2013/0194871 | A1* | 8/2013 | Lin et al. ................. 365/185.17 |
| 2013/0242654 | A1* | 9/2013 | Sim et al. ................ 365/185.05 |

FOREIGN PATENT DOCUMENTS

| KR | 1020100036520 | 4/2010 |
| KR | 1020100075098 | 7/2010 |
| KR | 1020100087743 | 8/2010 |
| KR | 1020100106911 | 10/2010 |

OTHER PUBLICATIONS

Notice of Allowance issued from the Korean Intellectual Property Office on May 8, 2012.
Notice of Preliminary Rejection issued from Korean Intellectual Property Office on Nov. 23, 2011.

* cited by examiner

*Primary Examiner* — Evan Pert
(74) *Attorney, Agent, or Firm* — IP & T Group LLP

(57) ABSTRACT

A non-volatile memory device includes a plurality of memory cells stacked along a channel protruded from a substrate, a first select transistor connected to one end of the plurality of memory cells, a first interlayer dielectric layer for being coupled between a source line and the first select transistor, and a second interlayer dielectric layer disposed between the first select transistor and the one end of the plurality of memory cells, and configured to include a first recess region.

6 Claims, 25 Drawing Sheets

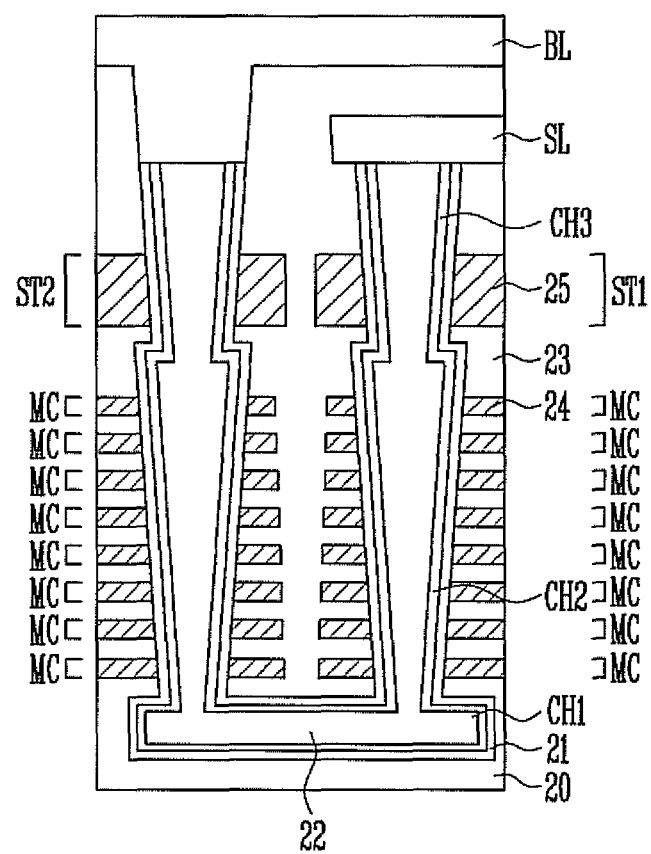

NON-VOLATILE MEMORY DEVICE AND METHOD OF MANUFACTURING THE SAME

CROSS-REFERENCE TO RELATED APPLICATION

Priority to Korean patent application number 10-2010-0115592 filed on Nov. 19, 2010, the entire disclosure of which is incorporated by reference herein, is claimed.

BACKGROUND

Exemplary embodiments relate to a semiconductor device and a method of manufacturing the same and, more particularly, to a 3-D non-volatile memory device and a method of manufacturing the same.

A non-volatile memory device retains data stored therein although a power supply is discontinued. Increasing the integration degree of memory devices having a 2-D structure which is fabricated in a single layer on a silicon substrate is reaching physical limits. Accordingly, a 3-D non-volatile memory device, in which memory cells are stacked vertically from a silicon substrate, is being developed.

Hereinafter, the structure of a conventional 3-D non-volatile memory device and features thereof are described with reference to relevant drawings.

FIG. 1 is a cross-sectional view of a conventional vertical channel-type non-volatile memory device.

As shown in FIG. 1, the conventional vertical channel-type non-volatile memory device includes a plurality of memory cells MC stacked along channels CH protruded from a substrate 10 including a source region S. Each of the memory cells MC includes the channel CH, a tunnel insulating layer, a charge trap layer, and a charge blocking layer 16 which surround the channel CH, and a gate electrode 15. Reference numeral '14' denotes an interlayer dielectric layer.

The plurality of memory cells MC is coupled in series between a lower select transistor LST and an upper select transistor UST to form one string STRING. The lower select transistor LST and the upper select transistor UST include the channel CH, gate insulating layers 13 and 19 surrounding the channel, and gate electrodes 12 and 18. Reference numerals '11 and 17' denote interlayer dielectric layers.

The channel of the upper select transistor UST of each of the strings STRING is coupled to a bit line BL.

In above-described vertical channel-type non-volatile memory device, the etch depth becomes deep according to an increase in the degree of integration of memory devices because the strings are arranged vertically from the substrate. Accordingly, there is a limit in increasing the degree of integration due to a limited etch process.

Furthermore, the vertical channel-type non-volatile memory device stores data using a charge trap type method of trapping electric charges in a deep level trap site within the charge trap layer. However, the charge trap type method has a slower erase speed than a floating gate type method of storing electric charges in the conduction band.

In particular, the vertical channel-type non-volatile memory device may not obtain a sufficient erase speed using, for example, only a method of discharging trapped charges when an erase operation is performed because the strings STRING are arranged vertically from the substrate. Accordingly, the trapped charge is to be discharged when the erase operation is performed and, at the same time, holes generated by Gate-Induced Drain Leakage (GIDL) are to be injected into the charge trap layer. In the conventional structure, however, the erase speed is slow and a probability that an erase error may occur is high because holes are not sufficiently generated by the GIDL.

FIGS. 2A and 2B are cross-sectional views of a conventional U-shaped channel-type non-volatile memory device. In particular, FIGS. 2A and 213 show an example in which the channel of a memory cell penetrates through a structure.

As shown, the conventional U-shaped channel-type non-volatile memory device is equipped with a plurality of memory cells MC stacked along the U-shaped channel. First and second select transistors ST1 and ST2 are provided at both ends of the U-shaped channel. Here, a string having the plurality of memory cells MC arranged in a U shape is formed between the first and the second select transistors ST1 and ST2. Furthermore, a bit line BL is coupled to the channel of the first select transistor ST1, and a source line SL is coupled to the channel of the second select transistor ST2.

The U-shaped channel includes a first channel CH1 buried in a pipe gate 20, a pair of second channels CH2 coupled to the first channel CH1, and a pair of third channels CH3 coupled to the second channels CH2, respectively. Each of the first channel CH1 and the second channels CH2 penetrates through a structure and has a hole at the center. An insulating layer 22 is buried in the central area. The third channel CH3 has a trench form or a burial form, which is described later.

Each of the memory cells MC includes a U-shaped channel, a tunnel insulating layer, a charge trap layer, and a charge blocking layer 21 which surround the U-shaped channel, and a gate electrode 24. Reference numeral '23' denotes an interlayer dielectric layer.

The first and second select transistors ST1 and ST2 are formed at both ends of the U-shaped channel and configured to include the channels CH3 and the gate insulating layer 21 and the gate electrode 25 surrounding the channels CH3. The tunnel insulating layer, the charge trap layer, and the charge blocking layer 21 of the memory cell MC and the gate insulating layer 21 of the first and the second select transistors ST1 and ST2 are assigned a same reference numeral because they may be formed to have the same material by forming them at the same time.

Here, the memory device may have a different structure according to a form of the channels CH3 of the first and the second select transistors ST1 and ST2. FIG. 2A shows a partially trenched structure and shows an example in which the memory cell MC has the channel partially penetrating a structure, but the select transistors ST1 and ST2 have buried channels. That is, the select transistors ST1 and ST2 are fully buried with a channel layer including the central area of the channel CH3. FIG. 2B shows a fully trenched structure and shows an example in which the memory cells MC and the first and the second select transistors ST1 and ST2 have a channel that fully penetrates a structure. That is, the memory cells MC and the first and the second select transistors ST1 and ST2 have a fully trenched structure (that is, an empty space is formed vertically throughout a structure) in which the central area of the channels CH1, CH2, and CH3 is empty and the insulating layer 22 is formed to fill the empty area.

The U-shaped channel-type non-volatile memory device having the above structure may be higher in the degree of integration of memory devices than the vertical channel-type non-volatile memory device. However, as in the vertical channel-type non-volatile memory device, the U-shaped channel-type non-volatile memory device may not generate a sufficient amount of holes generated by GIDL. This is because the conditions of the generation of GIDL are not satisfied in view of the structural characteristic of the U-shaped channel-type non-volatile memory device. This is described in detail below.

First, in order to generate a sufficient amount of holes through GIDL, N type impurities of a high concentration are to be doped into the channels CH3 of the first and the second select transistors ST1 and ST2.

In the memory device having the structure shown in FIG. 2A, however, the channel that penetrates a structure is formed on the inner wall of a trench for the channel, and the channel CH3 doped with the N type impurities of a high concentration is formed. Accordingly, a native oxide layer is formed at the interface of the trench channel and the channel CH3, thereby degrading device characteristic. Furthermore, in the memory device having the structure shown in FIG. 2B, the areas of the channels CH3 of the first and the second select transistors ST1 and ST2 into which impurities will be doped are narrow because the channels CH3 have a trench shape. Accordingly, dope impurities of a high concentration may not be implanted, and thus a probability that an erase error may occur is high as compared with the memory device having the structure shown in FIG. 2A.

Second, after N type impurities of a high concentration are doped into the channels CH3 of the first and the second select transistors ST1 and ST2, a thermal treatment process is to be performed at 900° C. or higher in order to activate the N type impurities. In a structure having a high aspect ratio of a channel, such as the structures shown in FIGS. 2A and 2B, if the thermal treatment process is performed at 900° C. or higher, the components (that is, polysilicon) of the channel CH3 migrate. Furthermore, if the thermal treatment process is performed at 800° C. or lower in order to prevent the migration, impurities are not sufficiently activated.

Third, if it is difficult to dope impurities of a high concentration into the channels CH3, GIDL may be generated by supplying a high voltage to the bit line BL or the source line SL. However, if voltage of 5 V or higher is supplied to the bit line BL or the source line SL, reliability of the memory device is degraded because a junction breakdown phenomenon occurs.

Fourth, in the memory device having the structure shown in FIG. 2B, the contact area of the channel and the bit line BL or the source line SL is narrow because the first and the second select transistors ST1 and ST2 have the channels CH3 that form trenches. Here, characteristics of the memory device are degraded because current is reduced due to increased contact resistance.

Consequently, the generation of holes due to GIDL is difficult in the structure of the conventional U-shaped channel-type non-volatile memory device. Accordingly, an erase error is generated and characteristics of the memory device are degraded.

FIGS. 3A and 3B are graphs showing the program/erase characteristics of the conventional U-shaped channel-type non-volatile memory device. The graph of FIG. 3A relates to the non-volatile memory device having the partial-trench structure described with reference to FIG. 2A, and the graph of FIG. 3B relates to the non-volatile memory device having the full trench structure described with reference to FIG. 2B. The X axis in each graph indicates a voltage, and the Y axis in each graph indicates a current. Furthermore, INI shows the reset state of the memory cell.

From the graphs, it can be seen that current does not rise even if a negative voltage is supplied to the gate electrode of the select transistor. That is, in the conventional structures, an erase error is generated because GIDL is not sufficiently generated in an erase operation. Furthermore, it can be seen that a junction breakdown occurs if voltage is raised in order to generate GIDL.

In particular, it can be seen that the non-volatile memory device having the full trench structure has poor erase characteristics because the channel area into which impurities will be doped and contact resistance is high.

BRIEF SUMMARY

Exemplary embodiments relate to a 3-D non-volatile memory device which is advantageous to the generation of holes due to GIDL and a method of manufacturing the same.

A non-volatile memory device according to an aspect of the present disclosure includes a plurality of memory cells stacked along a channel protruded from a substrate; a first select transistor connected to one end of the plurality of memory cells; a first interlayer dielectric layer for being coupled between a source line and the first select transistor; and a second interlayer dielectric layer disposed between the first select transistor and the one end of the plurality of memory cells, and configured to include a first recess region.

A method of manufacturing a non-volatile memory device according to yet another aspect of the present disclosure includes sequentially forming a first interlayer dielectric layer, a first conductive layer, and a second interlayer dielectric layer over a substrate; forming a trench for a channel by etching the second interlayer dielectric layer, the first conductive layer, and the first interlayer dielectric layer, wherein the second interlayer dielectric layer includes a first recess region; forming a first gate insulating layer on an inner wall of the trench; and forming the channel by filling the trench with a channel material over the first gate insulating layer.

A method of manufacturing a non-volatile memory device according to further yet another aspect of the present disclosure includes forming a plurality of memory cells that include a first channel buried in a pipe gate and a pair of second channels coupled to the first channel; sequentially forming a first interlayer dielectric layer, a first conductive layer, and a second interlayer dielectric layer over the plurality of memory cells including one of the pair of second channels; forming a trench for a channel by etching the second interlayer dielectric layer, the first conductive layer, and the first interlayer dielectric layer, wherein the second interlayer dielectric layer includes a first recess region; forming a gate insulating layer on an inner wall of the trench; and forming the channel by filling the trench with a channel material over the gate insulating layer.

BRIEF DESCRIPTION OF THE DRAWINGS

FIGS. 2A and 2B are cross-sectional views of a conventional U-shaped channel-type non-volatile memory device;

FIGS. 5A to 8D are cross-sectional views illustrating a method of manufacturing a 3-D non-volatile memory device according to a second embodiment of this disclosure;

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1:
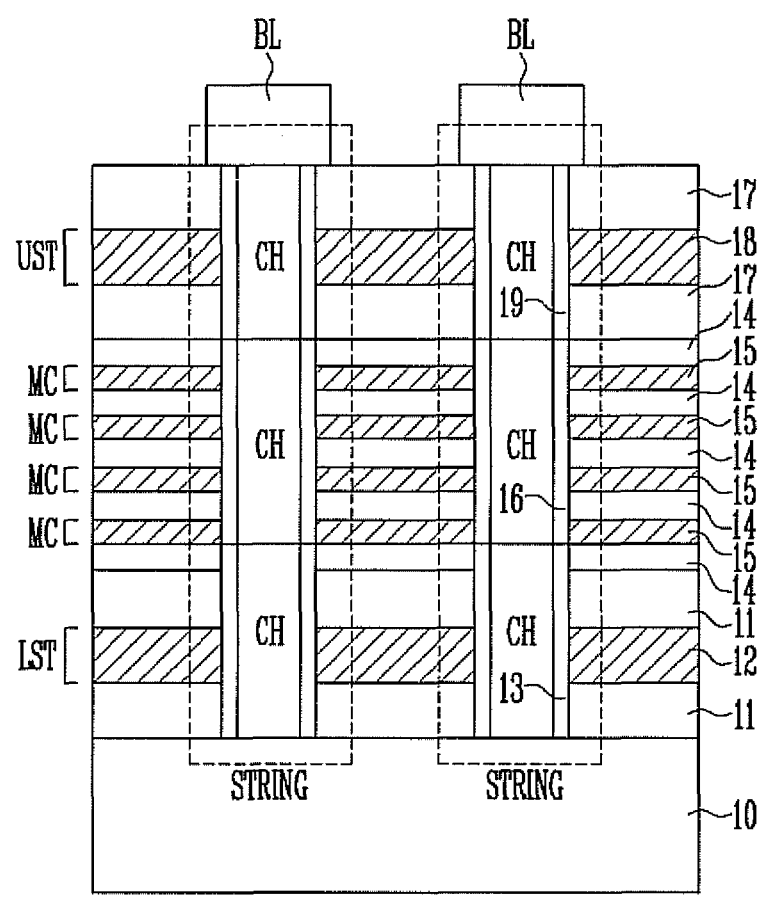
FIG. 1 is a cross-sectional view of a conventional vertical channel-type non-volatile memory device.
Figure 2A:
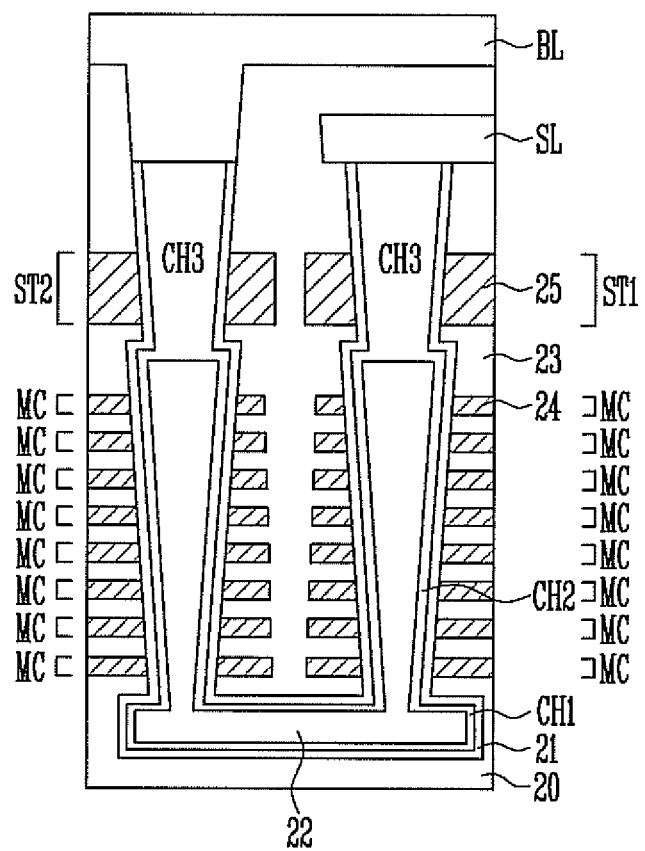
Figure 3A:
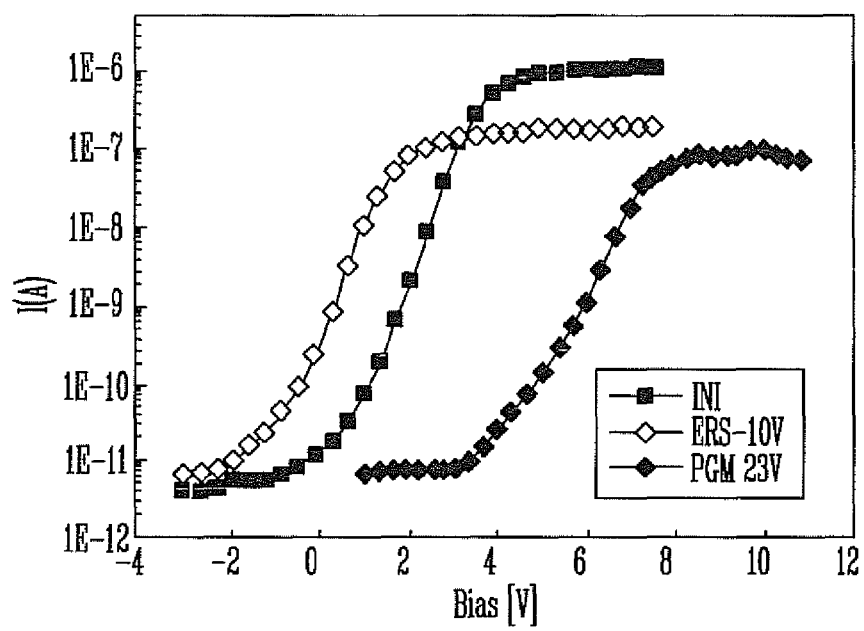
FIGS. 3A and 3B are graphs showing the program/erase characteristics of the conventional U-shaped channel-type non-volatile memory device.
Figure 3B:
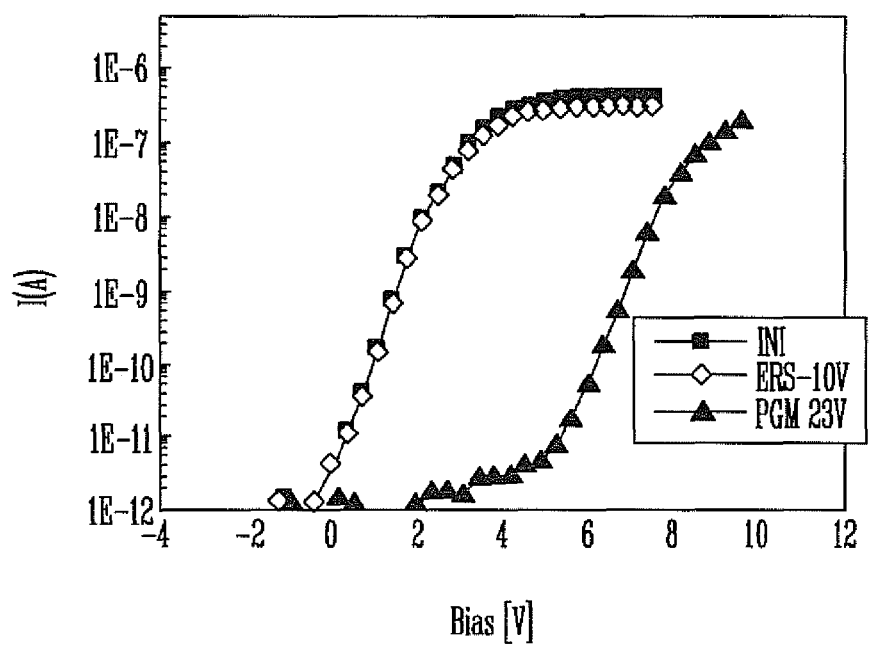
Figure 4A:
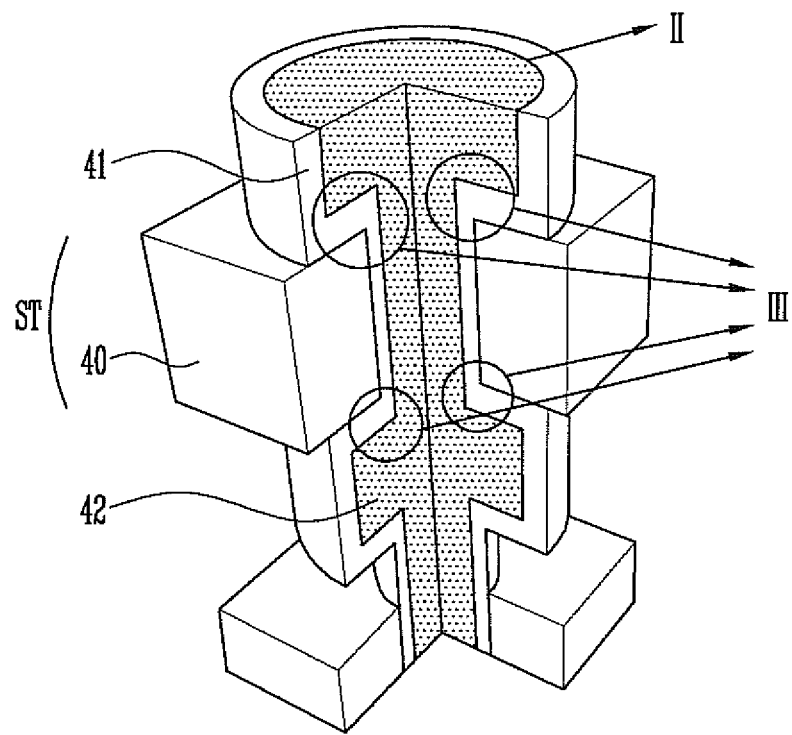
FIG. 4A is a perspective view showing the structure of a select transistor according to an embodiment of this disclosure.

FIG. 4A is a perspective view showing the structure of a select transistor according to an embodiment of this disclosure. An interlayer dielectric layer is omitted, for illustration purposes.

As shown in FIG. 4A, the select transistor ST according to the embodiment of this disclosure includes a channel 42 configured to have protrusions on its side wall, a gate electrode 40 configured to have corners III surrounded by the protrusion of the channel 42, and a gate insulating layer 41 interposed between the gate electrode 40 and the channel 42. In this structure, since the gate electrode 40 extends into the channel 42, a surface where the gate electrode 40 and the channel 42 are joined together are uneven to form 凹凸 shapes. In this figure, the protrusions are illustrated to be formed on the upper and lower portions of the channel 42. Here, the protrusion may be formed, for example, only on the upper portion of the channel 42.

Here, the select transistor ST has a gate-surrounded structure in which the entire surface of the channel 42 is surrounded by the gate electrode 40 and also has a structure in which the adjoining surface of the gate electrode 40 and the channel 42 has unevenness as described above. According to this structure, energy band bending is generated because an electric field is concentrated on the corners III of the gate electrode 40 in an erase operation. Accordingly, GIDL (Gate-Induced Drain Leakage) is easily generated.

Accordingly, if a select transistor having the above structure is applied to a 3-D non-volatile memory device, although N type impurities of a high concentration are not doped into the channel or high voltage is not applied to a bit line or the gate electrode 40 of a source line, sufficient GIDL can be generated by, for example, using the uneven structure of the channel 42 in the erase operation.

Furthermore, the contact area of the channel 42 and a bit line (not shown) or a source line (not shown but formed, for example, under the gate electrode 40) can be increased because the top portion of the channel 42 has a wide area II. Accordingly, contact resistance can be reduced, and impurities can be easily doped because the top area of the channel is increased.

Figure 4B:
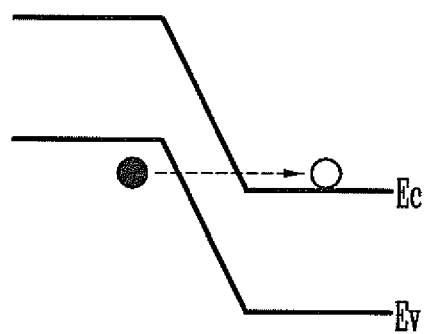
FIG. 4B is an energy band diagram illustrating a principle of GDIL generation in the 3-D non-volatile memory device according to an embodiment of this disclosure.

FIG. 4B is an energy band diagram illustrating a principle of GDIL generation in the 3-D non-volatile memory device according to the embodiment of this disclosure.

Since the adjoining surface of the channel 42 and the gate electrode 40 has unevenness as described above, an electric field is concentrated on the corners of the gate electrode 40 in an erase operation. Accordingly, when a voltage is supplied to the gate electrode of the select transistor in the erase operation, the energy band is abruptly distorted by a high electric field concentrated on the corners of the gate electrode 40. Accordingly, electric charges move from Ev to Ec by means of band to band tunneling. In particular, according to this disclosure, electric charges are easily moved because the interval between the bit line or the source line and the area where the gate electrode 40 extends is narrow (that is, 100 Å). That is, although the intrinsic channel 42 into which impurities have not been doped is used, sufficient GIDL can be generated.

Figure 5:
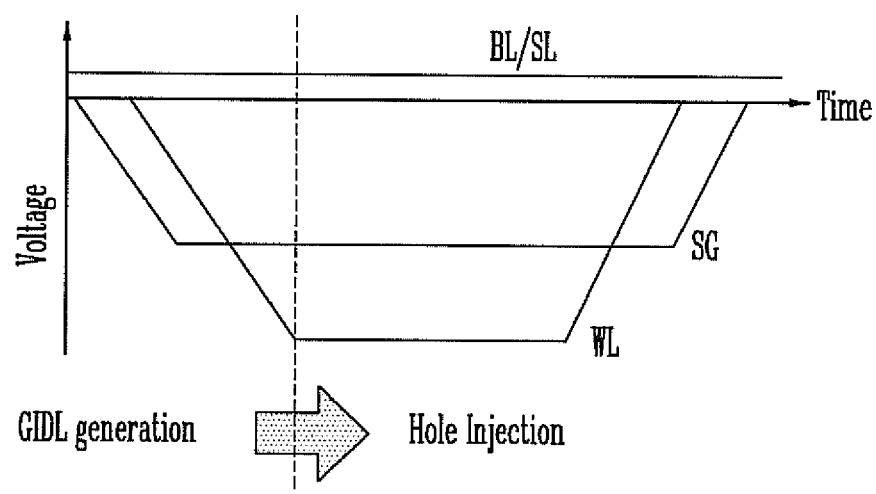
FIG. 5 is a timing diagram illustrating the erase operation of the 3-D non-volatile memory device according to an embodiment of this disclosure.

FIG. 5 is a timing diagram illustrating the erase operation of the 3-D non-volatile memory device according to an embodiment of this disclosure.

First, a source voltage is supplied to the bit line BL or the source line S, and a pass voltage for generating GIDL is supplied to the gate electrode SG of the select transistor. Here, according to an example, the source voltage has a positive value and the pass voltage have a negative value. In particular, since GIDL is generated due to a difference between the source voltage and the pass voltage, the difference between the source voltage and the pass voltage according to an example is 10 V or higher.

When GIDL is generated in the uneven channel of the select transistors, an erase voltage is supplied to the gate electrodes (that is, a word line WL) of memory cells so that holes are injected into the charge trap layers of the memory cells. Here, according to an example, the erase voltage has a negative value and has an absolute value greater than the pass voltage.

Figure 6:
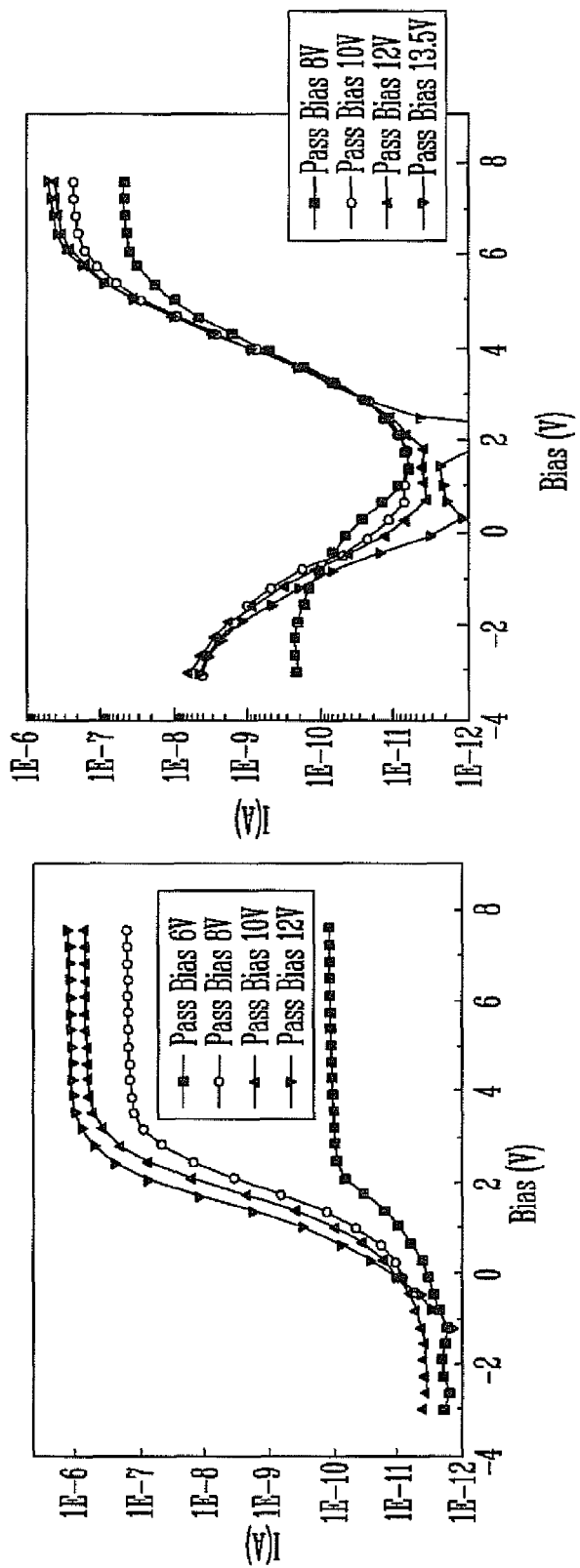
FIG. 6 is a graph showing the characteristics of the 3-D non-volatile memory device according to the embodiment of this disclosure.

FIG. 6 is a graph showing the characteristics of the 3-D non-volatile memory device according to the embodiment of this disclosure.

A graph on the left side shows the characteristic of a 3-D non-volatile memory device, in which the channels of select transistors do not have the uneven structure. A graph on the right side shows the characteristic of the 3-D non-volatile memory device, in which the channels of the select transistors have the uneven structure according to the embodiment of this disclosure. In FIG. 6, an X axis indicates a voltage, and a Y axis indicates a current.

The graph on the right side shows that when a negative voltage is supplied to the gate electrode 40 of the select transistor, the amount of current flowing through the channel of the memory cells MC first decreases and, subsequently increases drastically. Accordingly, it can be seen that GIDL is generated because the amount of current drastically increases.

Meanwhile, the graph on the left side reveals that although a negative voltage is supplied to the gate electrode of the select transistor, the amount of current flowing through the channel of the memory cells MC does not increase (that is, GIDL is not generated).

FIGS. 7A to 7G are cross-sectional views illustrating a method of manufacturing a 3-D non-volatile memory device according to a first embodiment of this disclosure.

Figure 7A:
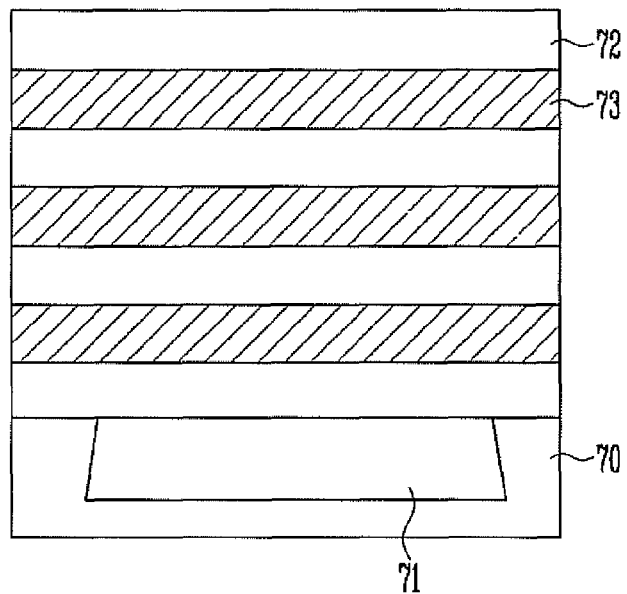
FIGS. 7A to 7G are cross-sectional views illustrating a method of manufacturing a 3-D non-volatile memory device according to a first embodiment of this disclosure.

As shown in FIG. 7A, an interlayer dielectric layer (not shown) and a pipe gate 70 are formed over a substrate (not shown). The pipe gate 70 is etched to form a first trench. A first sacrificial layer 71 is buried in the first trench. The first sacrificial layer 71 may be a nitride layer. The first trench is used to form a U-shaped channel. According to an example, the first trench may be formed by taking an interval between second channels, formed in a subsequent process, into consideration.

A plurality of first material layers and a plurality of second material layers are alternately formed on the resulting structure in which the first sacrificial layer 71 is filled.

The first material layers and the second material layers are stacked for forming a plurality of word lines stacked over the substrate. Each of the first material layers is used to form an interlayer dielectric layer for separating the word lines from each other, and each of the second material layers is used to form the word line through a subsequent process.

The first material layer and the second material layer are made of material having a great etch selectivity. For example, the first material layer may be formed of an interlayer dielectric layer or a sacrificial layer, and the second material layer may be formed of a conductive layer or a sacrificial layer for the word line.

In the first embodiment, the first material layer is an interlayer dielectric layer 72 and the second material layer is a conductive layer 73.

Each of the interlayer dielectric layer 72 and the conductive layer 73 according to an example is 100 to 800 Å in thickness and may be deposited by a CVD or ALD method.

According to an example, the number of each of the stacked interlayer dielectric layers 72 and the stacked conductive layers 73 are to be determined by taking the number of memory cells to be stacked along the U-shaped channel into consideration. The conductive layers 73 are used to form the gate electrodes of the memory cells (that is, word lines) and may be a polysilicon layer.

Figure 7B:
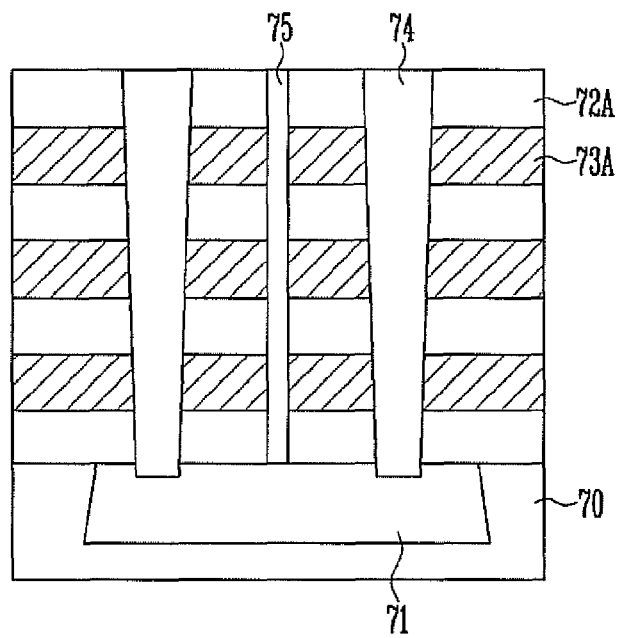

As shown in FIG. 7B, the plurality of interlayer dielectric layers 72 and the plurality of conductive layers 73 are etched to form a pair of second trenches coupled to the first trench. The second trenches are used to form a U-shaped channel. According to an example, the two second channels are to be included in an U-shaped channel. For example, the two second trenches may be formed so that they are coupled in a U form by the first trench while a surface of the first sacrificial layer 71 buried in the first trench is exposed.

In this figure, the etched interlayer dielectric layer is assigned reference numeral '72A', and the etched conductive layer is assigned reference numeral '73A'.

A second sacrificial layer 74 is buried in the second trenches. The second sacrificial layer 74 may be a nitride layer. Accordingly, a trench for a U-shaped channel in which the sacrificial layer is buried is formed.

After the plurality of interlayer dielectric layers 72A and the plurality of conductive layers 73A between the two second trenches coupled by the first trench are etched, an insulating layer 75 is buried in the etched region. Accordingly, the conductive layers 73A on both sides are separated so that the gate electrodes of memory cells adjacent to each other horizontally are separated from each other.

Figure 7C:
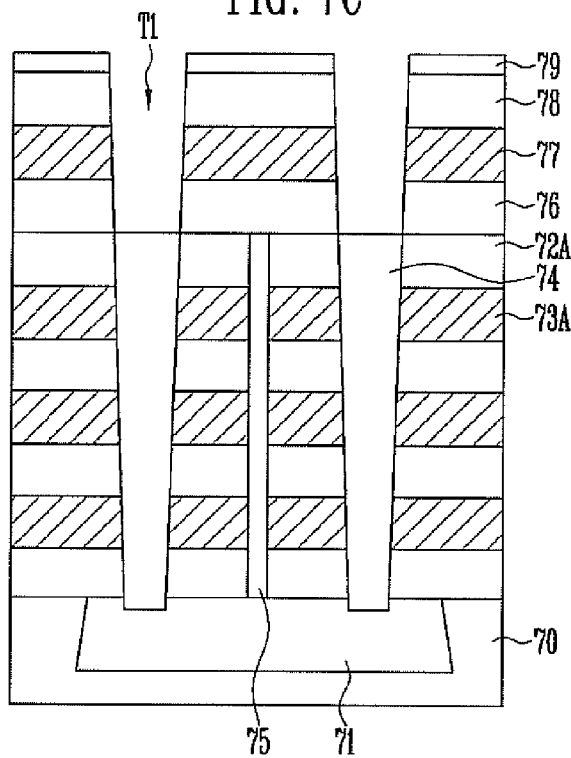

As shown in FIG. 7C, a first interlayer dielectric layer 76, a first conductive layer 77, and a second interlayer dielectric layer 78 are sequentially formed over the resulting structure in which the insulating layer 75 is buried. They are used to form a first select transistor coupled to a source line and a second select transistor coupled to a bit line. The first select transistor is formed over the highest memory cell on one side, from among the plurality of memory cells stacked in a U shape, and the second select transistor is formed over the highest memory cell on the other side, from among the plurality of memory cells stacked in a U shape.

The first conductive layer 77 is used to form the gate electrodes of the first and the second select transistors and may be a doped polysilicon layer into which impurities have been doped. According to an example, a mask pattern 79 is to be formed over the second interlayer dielectric layer 78. The mask pattern 79 may be a nitride layer.

Trenches T1 for channels through which a surface of the second sacrificial layer 74 is exposed are formed by etching the second interlayer dielectric layer 78, the first conductive layer 77, and the first interlayer dielectric layer 76 by using the mask pattern 79 as an etch barrier. Here, the etch process according to an example is a dry etch process.

Figure 7D:
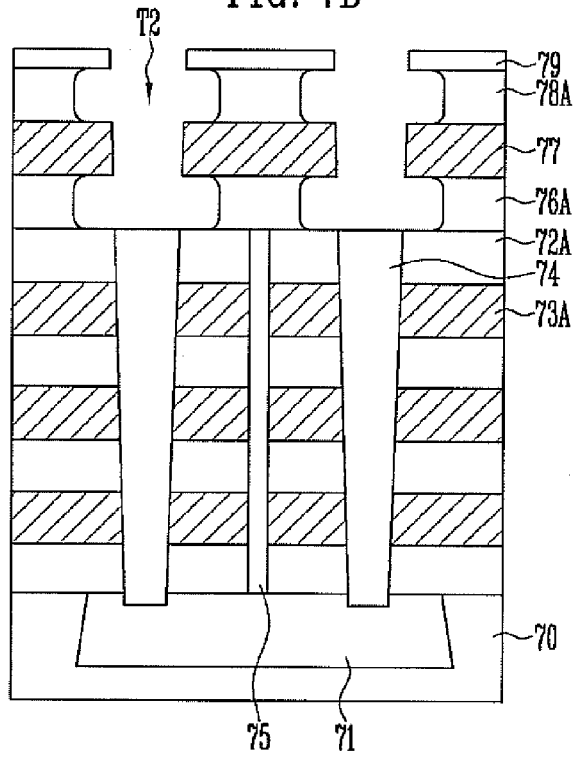

As shown in FIG. 7D, portions of the first interlayer dielectric layer 76 and the second interlayer dielectric layer 78, exposed to the inner walls of the trenches T1, are recessed to a desired thickness. When the first interlayer dielectric layer 76 and the second interlayer dielectric layer 78 are selectively recessed as described above, trenches T2 for channels including the recess regions are formed.

According to an example, each of the first interlayer dielectric layer 76 and the second interlayer dielectric layer 78 is to be recessed by a thickness equal to 100 to 500 Å. According to an example, the recess process may be a wet etch process.

In this figure, the first interlayer dielectric layer partially recessed is assigned reference numeral '76A', and the second interlayer dielectric layer partially recessed is assigned reference numeral '78A'.

Figure 7E:
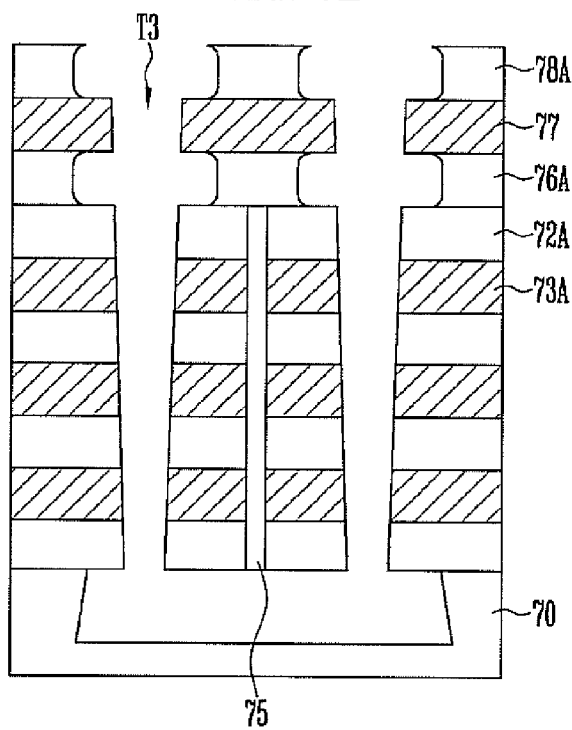

As shown in FIG. 7E, a trench T3 for a U-shaped channel is formed by removing the second sacrificial layer 74 and the first sacrificial layer 71 which are exposed to the bottom of the trenches T2. According to an example, a process of removing the first sacrificial layer 71 and the second sacrificial layer 74 may be a wet dip-out process or a strip process. In this process, the mask pattern 79 may also be removed.

The trench T3 is a resulting structure in which the first trench, the second trenches, and the trenches T2 for channels are combined together and is used to form the U-shaped channel forming one string.

Figure 7F:
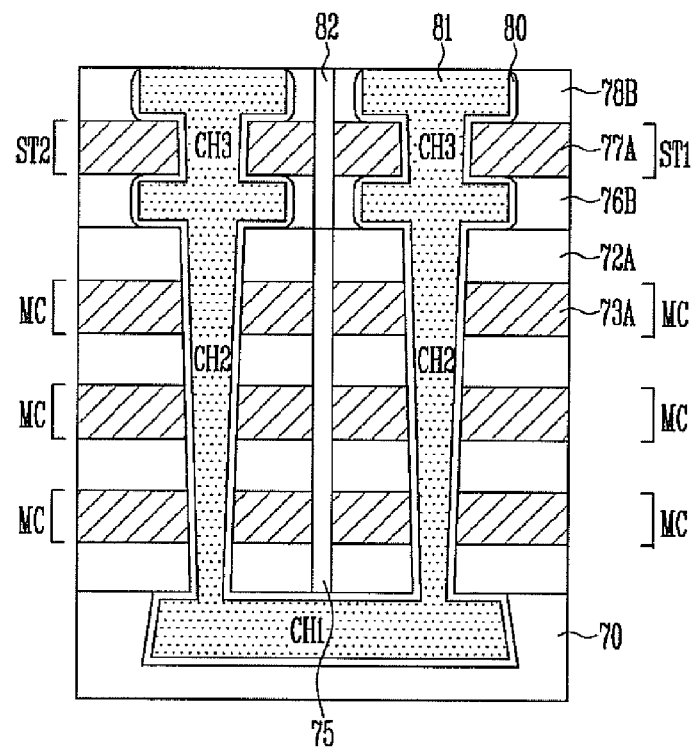

As shown in FIG. 7F, a charge blocking layer, a charge trap layer, and a tunnel insulating layer 80 are sequentially formed over the inner wall of the trench T3. A plasma nitrification process may be performed before and after each of the charge blocking layer, the charge trap layer, and the tunnel insulating layer 80 is formed, according to an example. In this figure, the charge blocking layer, the charge trap layer, and the tunnel insulating layer are illustrated to be one layer, for the sake of convenience.

The charge blocking layer functions to prevent charges, trapped in the charge trap layer, from moving in the direction of the gate electrode. The charge blocking layer may be made of a $SiO_2$ or $SiO_2$ compound or may be made of high dielectric constant (high-k) material, such as $Al_2O_3$, $La_2O_3$, $HfO_2$, $TiO_2$, $ZrO_2$, or a compound thereof. According to an example, the charge blocking layer may be 100 Å or lower in thickness and be deposited using a CVD or ALD method.

The charge trap layer functions as a kind of a data depository for trapping charges in a deep level trap site or discharging the charges. For example, the charge trap layer may be a nitride layer, and the composition ratio of N:Si may be controlled. In some embodiments, the charge trap layer may be formed of a polysilicon layer. Furthermore, the charge trap layer may be deposited using a CVD or ALD method.

The tunnel insulating layer functions as an energy barrier layer for Fowler-Nordheim (F—N) tunneling of charges. The tunnel insulating layer may be an oxide layer, formed using a High Temperature Oxidation (HTO) method, a radical oxidation method, or a plasma oxidation method, or may be deposited using a CVD or ALD method.

A layer 81 for a channel is formed on the entire structure in which the charge blocking layer, the charge trap layer, and the tunnel insulating layer 80 are formed, thereby filling the trench T3. The layer 81 may be an undoped polysilicon layer into which impurities have not been doped or may be a polysilicon layer into which N type impurities have been doped. For example, the N type impurities may include As or Ph. According to an example, a concentration of the impurities be 5E18 atoms/cm$^3$ or lower.

Next, the U-shaped channel is formed by performing a polishing process until a surface of the second interlayer dielectric layer 78A is exposed. Accordingly, the channels CH3 of the select transistors, having protrusions on its upper and lower portions, are formed. The channels CH3 of the select transistors surround the top corners and the bottom corners of the conductive layer 77A by means of the upper protrusion and the lower protrusion buried in the recess regions.

Here, according to an example, N type impurities may be doped into the layer 81 using an ion implantation process before or after the polishing process. The N type impurities may include As or Ph. According to an example, a concentration of the impurities may be 1E20 atoms/cm$^3$ or higher. Furthermore, at a junction depth that the impurities are implanted according to an example is set so that it does not reach the first conductive layer 77 nor partially overlap with the first conductive layer 77.

Next, the second interlayer dielectric layer 78A, the first conductive layer 77, and the first interlayer dielectric layer 76A within the U-shaped channel are partially etched to form a slit for separating the gate electrode of a first select transistor ST1 on one end of the U-shaped channel and the gate electrode of a second select transistor ST2 on the other end thereof from each other. An insulating layer 82 is buried in the slit. In this figure, the etched second interlayer dielectric layer is assigned reference numeral '78B', the etched first conductive layer is assigned reference numeral '77A', and the etched first interlayer dielectric layer is assigned reference numeral '76A'.

The gate electrodes may also be separated from each other before the first and second select transistors ST1 and ST2 are formed. In other words, the second interlayer dielectric layer 78A, the first conductive layer 77, and the first interlayer dielectric layer 76A within the U-shaped channel are etched to form the slit. After the insulating layer 82 is buried in the slit, the first and the second select transistors ST1 and ST2 may be formed.

Accordingly, the U-shaped channel is composed of the first channel CH1 buried in the first trench, the second channels CH2 buried in the second trenches, and the third channels CH3 buried in the trenches T2 for channels. Furthermore, a plurality of memory cells MC is stacked along the U-shaped channel, and the first and the second select transistors ST1 and ST2 are formed over the memory cells MC stacked in a U shape. Here, the plurality of memory cells MC are coupled in series between the first select transistor ST1 and the second select transistor ST2 to form one string.

Figure 7G:
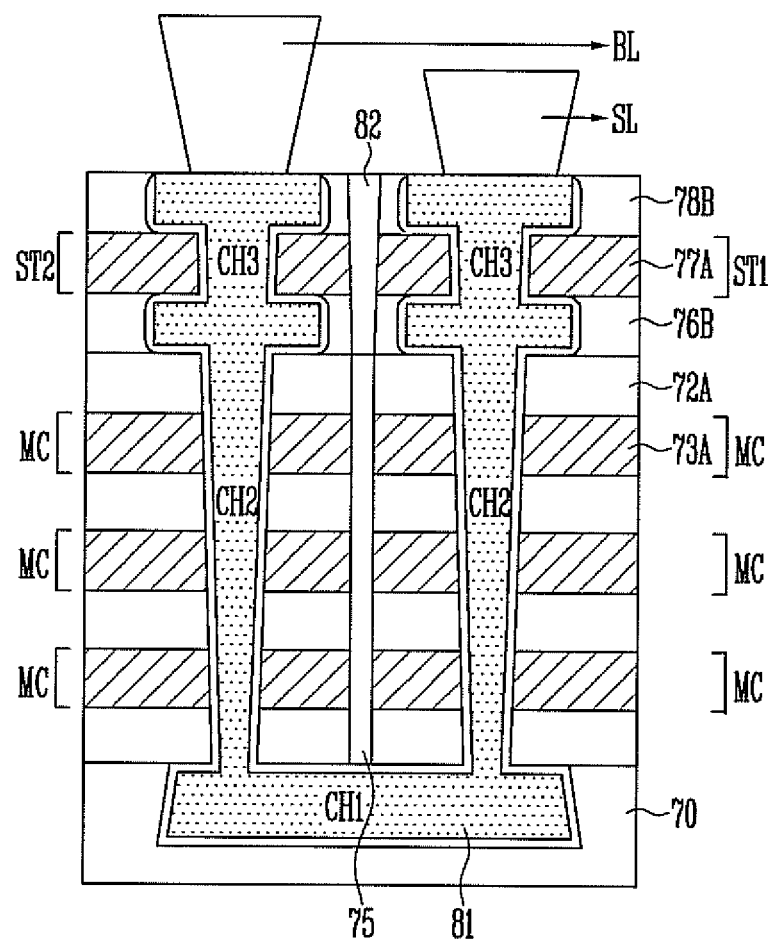

As shown in FIG. 7G, a source line SL is formed and coupled to the channel CH3 of the first select transistor ST1 formed over the memory cell MC on one side, from among the plurality of memory cells MC stacked in a U shape. A bit line BL is formed and coupled to the channel CH3 of the second select transistor ST2 formed over the memory cell MC on the other side, from among the plurality of memory cells MC stacked in a U shape.

In the first embodiment, while both the first select transistor ST1 and the second select transistor ST2, forming one string, have been illustrated to have the uneven surfaces, the exemplary embodiments are not limited thereto. In some embodiments of this disclosure, only one of the two select transistors ST1 and ST2 included in one string may have a channel having an uneven structure. For example, only the first select transistor ST1 adjoining the source line SL may have a channel having an uneven structure.

Furthermore, in the first embodiment, an example in which the gate insulating layer of the first and the second select transistors ST1 and ST2 is formed of the charge blocking layer, the charge trap layer, and the tunnel insulating layer has been described, but this disclosure is not limited thereto. In some embodiments of this disclosure, the charge blocking layer, the charge trap layer, and the tunnel insulating layer for the plurality of memory cells MC may be formed, and the gate insulating layer for the select transistor ST may be formed. For example, the charge blocking layer, the charge trap layer, and the tunnel insulating layer for the plurality of memory cells MC may be formed of an oxide layer, a nitride layer, and an oxide layer. The gate insulating layer for the first and the second select transistors ST1 and ST2 may be formed of an oxide layer.

Furthermore, in the first embodiment, while an example in which the plurality of interlayer dielectric layers 72 and the plurality of conductive layers 73 are alternately formed to form the plurality of memory cells MC has been described, exemplary embodiments are not limited thereto. For example, the plurality of interlayer dielectric layers and the plurality of sacrificial layers may be alternately formed to form a trench for a U-shaped channel. Next, control gate electrodes may be formed by removing a sacrificial layer. This is described in detail with reference to FIGS. 12A to 12H.

FIGS. 8A to 8D are cross-sectional views illustrating a method of manufacturing a 3-D non-volatile memory device according to a second embodiment of this disclosure.

Figure 8A:
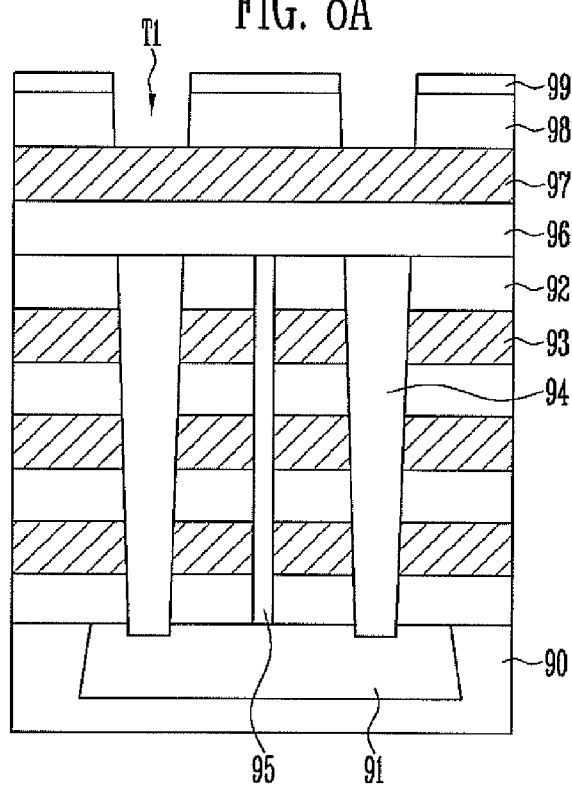

As shown in FIG. 8A, after a first trench and second trenches are formed, a first sacrificial layer and a second sacrificial layer are buried in the first trench and the second trenches. Processes up to here are the same as those described with reference to FIGS. 7A and 7B of the first embodiment, and thus a detailed description thereof is omitted. In this figure, reference numeral '90' denotes a pipe gate, '91' denotes the first sacrificial layer, '92' denotes an interlayer dielectric layer, '93' denotes a conductive layer, '94' denotes the second sacrificial layer, and '95' denotes an insulating layer.

Next, a first interlayer dielectric layer 96, a first conductive layer 97, and a second interlayer dielectric layer 98 are sequentially formed over the resulting structure in which the insulating layer 95 is buried. According to an example, a mask pattern 99 may be formed on the second interlayer dielectric layer 98.

Next, upper portions T1 of trenches for channels through which a surface of the first conductive layer 97 is exposed are formed by etching the second interlayer dielectric layer 98 by using the mask pattern 99 as an etch barrier.

Figure 8B:
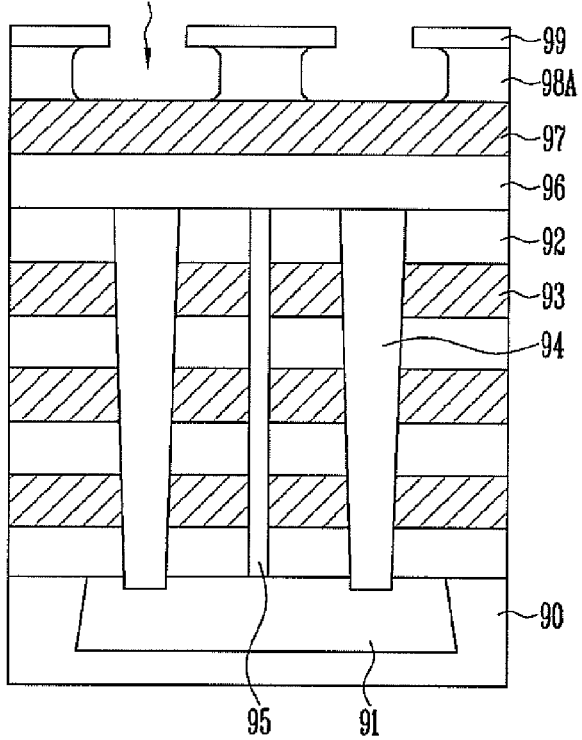

As shown in FIG. 8B, portions of the second interlayer dielectric layer 98, exposed to the inner walls of the upper portions T1 of the trenches for channels, are recessed to a desired thickness. According to an example, the recess process may be a wet etch process. According to an example, the recess process may be performed under a condition that the etch selectivity among the second interlayer dielectric layer 98, the mask pattern 99, and the first conductive layer 97 is great so that only the second interlayer dielectric layer 98 is selectively recessed. Accordingly, the width of each of upper portions of the trenches for channels is extended (refer to T2). In this figure, the second interlayer dielectric layer 98 partially recessed is assigned reference numeral '98A'.

Figure 8C:
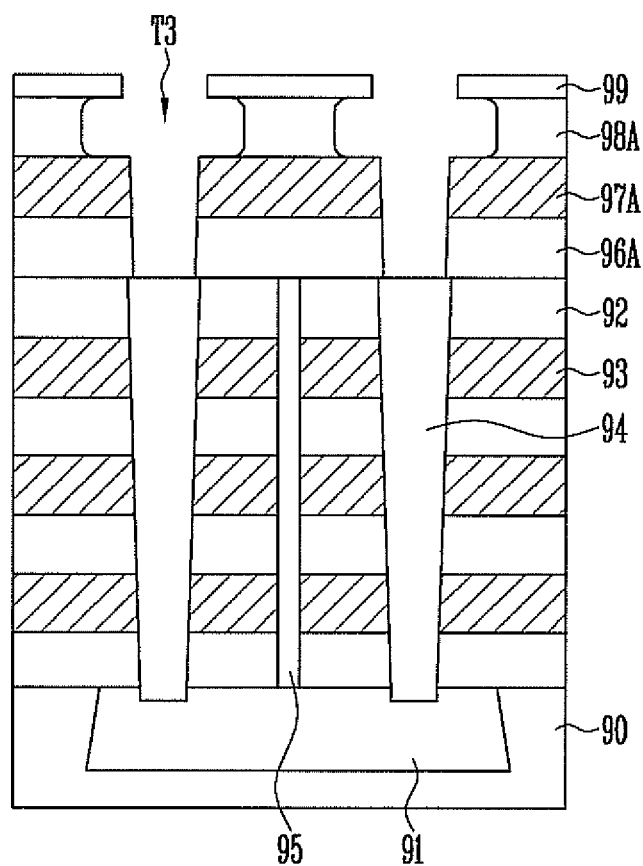

As shown in FIG. 8C, the first conductive layer 97 and the first interlayer dielectric layer 96 are etched using the mask pattern 99 as an etch barrier, thereby forming lower portions of the trenches for channels. According to an example, the etch process may be a dry etch process. Accordingly, trenches T3 for channels, each having a recess region in which the second interlayer dielectric layer 98A is selectively further recessed, are formed. In this figure, the etched conductive layer is assigned reference numeral '97A', and the etched first interlayer dielectric layer is assigned reference numeral '96A'.

Figure 8D:
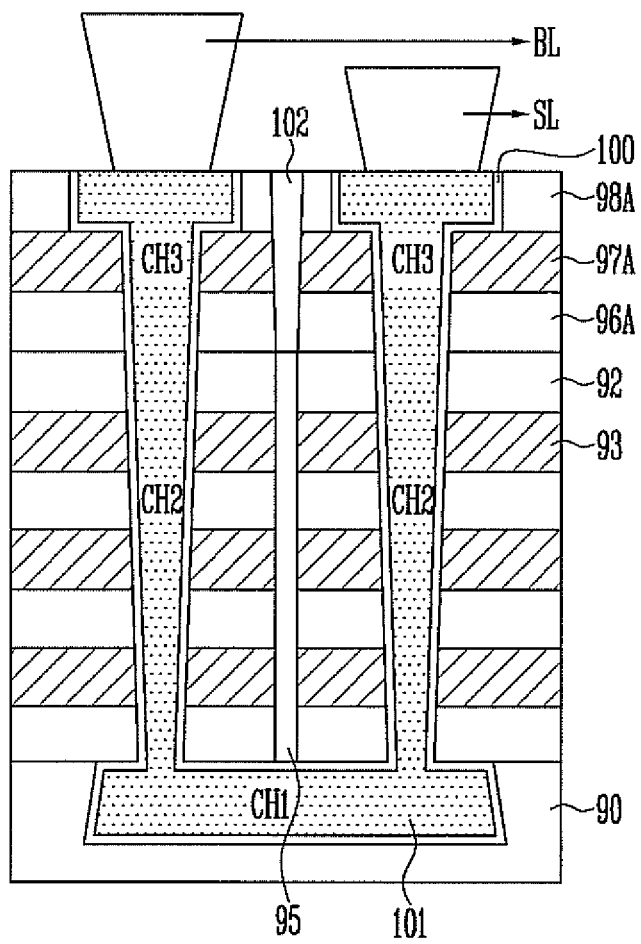

As shown in FIG. 8D, the second sacrificial layer 94 and the first sacrificial layer 91, exposed to the bottom surfaces of the trenches T3 for channels, are removed to form a trench for a U-shaped channel. Next, after a charge blocking layer, a charge trap layer, and a tunnel insulating layer 100 are sequentially formed along the inner surface of the trench, a layer 101 for a channel is buried in the trench for a U-shaped channel. Accordingly, the channels CH3 of select transistors are formed, and the U-shaped channel, including the channels CH3 of the select transistors and the channels CH1 and CH2 of a plurality of memory cells, is formed.

Upper protrusions of the channels CH3 of the select transistors are buried in the recess regions and configured to surround the gate electrodes of the select transistors (that is, the top corners of the conductive layer 97A).

Next, the second interlayer dielectric layer 98A, the first conductive layer 97A, and the first interlayer dielectric layer 96A within the U-shaped channel are etched to form a slit. Accordingly, the gate electrodes of the select transistors at both ends of the U-shaped channel are separated from each other by the slit. Next, an insulating layer 102 is buried in the slit. In some embodiments, the slit may be formed by etching the second interlayer dielectric layer 98A, the first conductive layer 97A, and the first interlayer dielectric layer 96A within the U-shaped channel. After the insulating layer 102 is buried in the slit, the first and the second select transistors ST1 and ST2 may be formed.

A bit line BL and a source line SL are formed and coupled to the respective channels of the select transistors ST1 and ST2.

In accordance with the second embodiment, the protrusions are formed, for example, only on the upper portions of the channels by recessing only the second interlayer dielectric layer 98A. Accordingly, an electric field is concentrated on, for example, only the top corners of the gate electrodes of the select transistors. Accordingly, the gate electrodes of memory cells formed under the select transistors can be prevented from being influenced by a strong electric field concentrated on the corners of the gate electrodes.

Figure 9A:
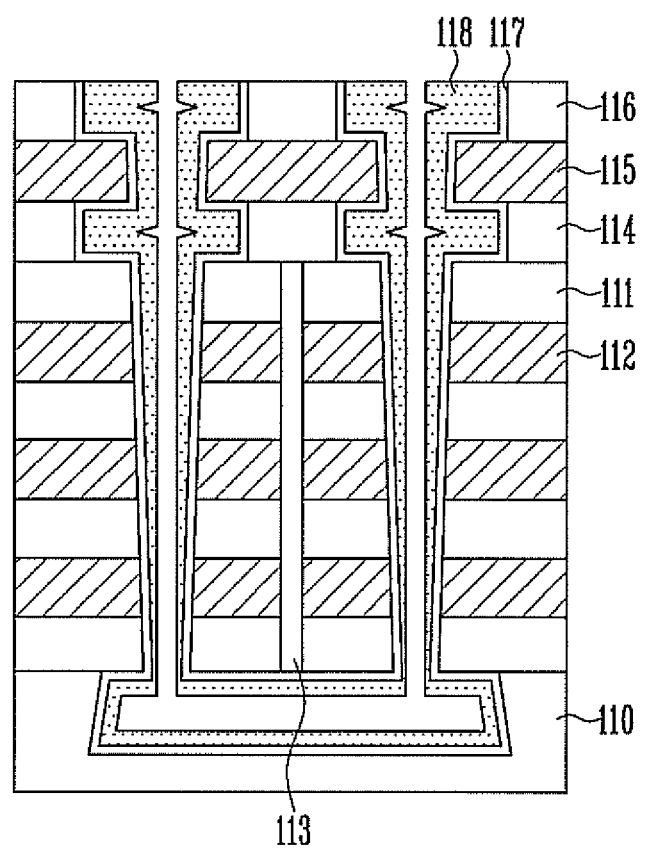
FIGS. 9A and 9B are cross-sectional views illustrating a method of manufacturing a 3-D non-volatile memory device according to a third embodiment of this disclosure.
Figure 9B:
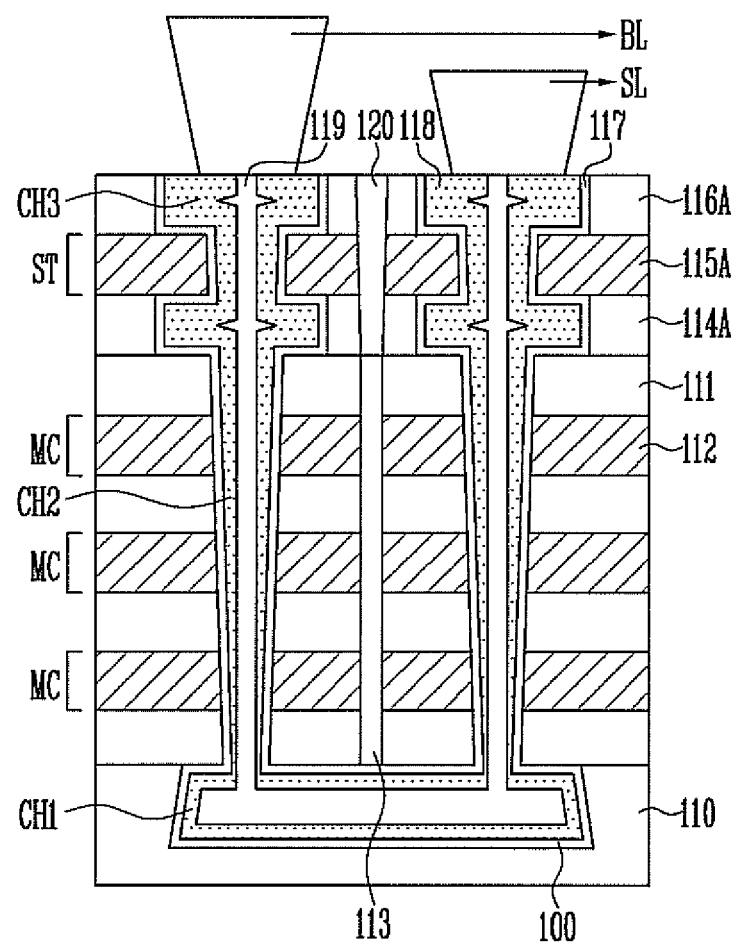

FIGS. 9A and 9B are cross-sectional views illustrating a method of manufacturing a 3-D non-volatile memory device according to a third embodiment of this disclosure. In particular, a method of manufacturing a non-volatile memory device having a full trench-type U-shaped channel is described below.

As shown in FIG. 9A, a trench for a U-shaped channel is formed. Processes up to here are the same as those described with reference to FIGS. 7A to 7E of the first embodiment, and thus a detailed description thereof is omitted. In this figure, reference numeral '110' denotes a pipe gate, '111' denotes an interlayer dielectric layer, '112' denotes a conductive layer, '113' denotes an insulating layer, '114' denotes a first interlayer dielectric layer, '115' denotes a first conductive layer, and '116' denotes a second interlayer dielectric layer.

A charge blocking layer, a charge trap layer, and a tunnel insulating layer 117 are formed along the inner surface of the trench. Next, a layer 118 for channels is formed on the entire surface of the trench in which the charge blocking layer, the charge trap layer, and the tunnel insulating layer 117 are formed. According to an example, the deposition thickness of the layer 118 may be controlled so that the center area of the trench is opened. For example, the deposition thickness may be 100 to 300 Å.

As shown in FIG. 9B, an insulating layer 119 is buried in the trench in which the layer 118 is formed. The insulating layer 119 may be an oxide layer formed using a High Temperature Oxidation (HTO) process, a Tetra Ethyl Ortho Silicate (TEOS) layer, a Spin On Dielectric (SOD) layer, a Spin On Glass (SOG) layer.

Accordingly, select transistors ST are formed over memory cells MC, stacked along the U-shaped channel, and memory cells MC stacked in a U shape. The U-shaped channel includes the channels CH1 and CH2 of the plurality of memory cells MC and the channels CH3 of the select transistors ST, all of which have a trench shape.

Next, the second interlayer dielectric layer 116, the first conductive layer 115, and the first interlayer dielectric layer 114 within the U-shaped channel are etched. An insulating layer 120 is buried in the etched region. In this figure, the etched second interlayer dielectric layer is assigned reference numeral '116A', the etched first conductive layer is assigned reference numeral '115A', and the etched first interlayer dielectric layer is assigned reference numeral '114A'.

A bit line BL and a source line SL are formed and coupled to the respective channels of the select transistors ST.

In accordance with the third embodiment, although the full trench-type channel structure is formed, the area of the channel can be increased by the region into which the second interlayer dielectric layer 116 is recessed. Accordingly, contact resistance can be reduced because the contact area between the channel and the bit line or between the channel and the source line is increased.

In the third embodiment, the method of forming channels having uneven structures using the first embodiment has been described, but this is for illustration purposes and this disclosure is not limited thereto. The method of forming a channel having an uneven structure according to the second embodiment may also be applied to the method according to the third embodiment.

Figure 10A:
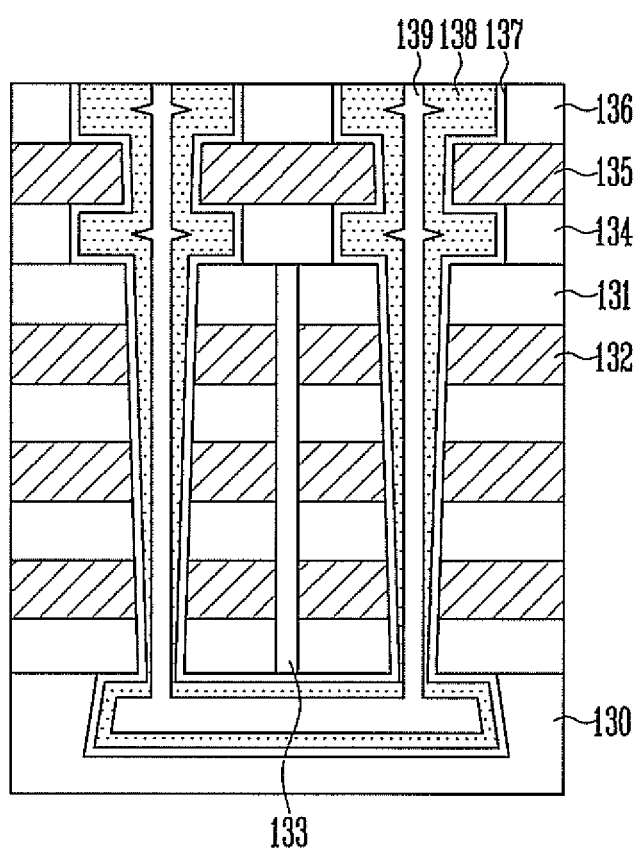
FIGS. 10A and 10B are cross-sectional views illustrating a method of manufacturing a 3-D non-volatile memory device according to a fourth embodiment of this disclosure.
Figure 10B:
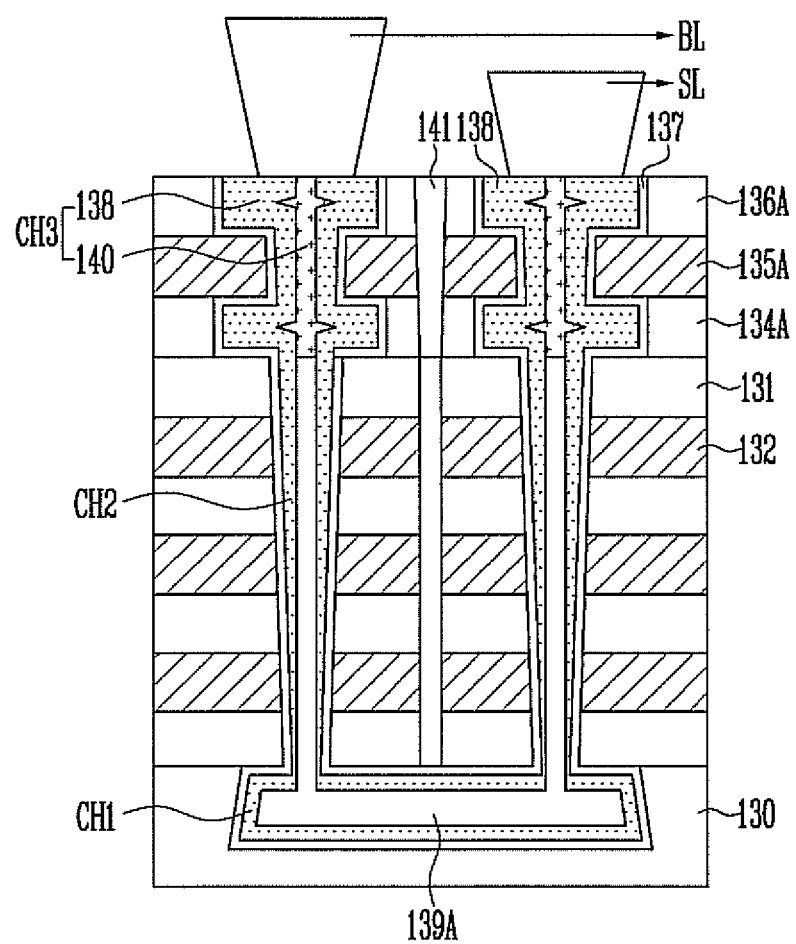

FIGS. 10A and 10B are cross-sectional views illustrating a method of manufacturing a 3-D non-volatile memory device according to a fourth embodiment of this disclosure. In particular, a method of manufacturing a non-volatile memory device having a partial trench-type U-shaped channel is described below.

As shown in FIG. 10A, a trench for a U-shaped channel is formed. Processes up to here are the same as those described with reference to FIGS. 7A to 7E according to the first embodiment, and a detailed description thereof is omitted. In this figure, reference numeral '130' denotes a pipe gate, '131' denotes an interlayer dielectric layer, '132' denotes a conductive layer, '133' denotes an insulating layer, '134' denotes a first interlayer dielectric layer, '135' denotes a first conductive layer, and '136' denotes a second interlayer dielectric layer.

A charge blocking layer, a charge trap layer, and a tunnel insulating layer 137 are formed along the inner surface of the trench. A layer 138 for channels is formed on the entire surface of the trench in which the charge blocking layer, the charge trap layer, and the tunnel insulating layer 137 are formed. An insulating layer 139 is buried in the trench in which the layer 138 is formed.

As shown in FIG. 10B, the insulating layer 139 is etched back so that the channel areas of select transistors are opened. In this figure, the etched-back insulating layer is assigned reference numeral '139A'. Next, a layer 140 for channels is buried in the etched-back regions, thereby completing the channels of the select transistors, including the layer 140 for channels and the layer 138 for channels.

Accordingly, select transistors ST are formed over a plurality of memory cells MC, stacked along the U-shaped channel, and memory cells MC stacked in a U shape. Here, the U-shaped channel includes the channels CH1 and CH2 of the memory cells MC and the channels CH3 of the select transistors ST. The channels CH1 and CH2 of the memory cells MC have a trench shape, and the layer 140 has a burial form up to the central regions of the channels CH3 of the select transistors ST.

Next, the second interlayer dielectric layer 136, the first conductive layer 135, and the first interlayer dielectric layer 134 within the U-shaped channel are etched. An insulating layer 141 is buried in the etched region. In this figure, the etched second interlayer dielectric layer is assigned reference numeral '136A', the etched first conductive layer is assigned reference numeral '135A', and the etched first interlayer dielectric layer is assigned reference numeral '134A'.

A bit line BL and a source line SL are formed and coupled to the respective channels of the select transistors.

In the fourth embodiment, the method of forming channels having uneven structures using the first embodiment has been described, but this is only description illustration purposes and this disclosure is not limited thereto. The method of forming channels having uneven structures according to the second embodiment may also be applied to the method according to the fourth embodiment.

Figure 11A:
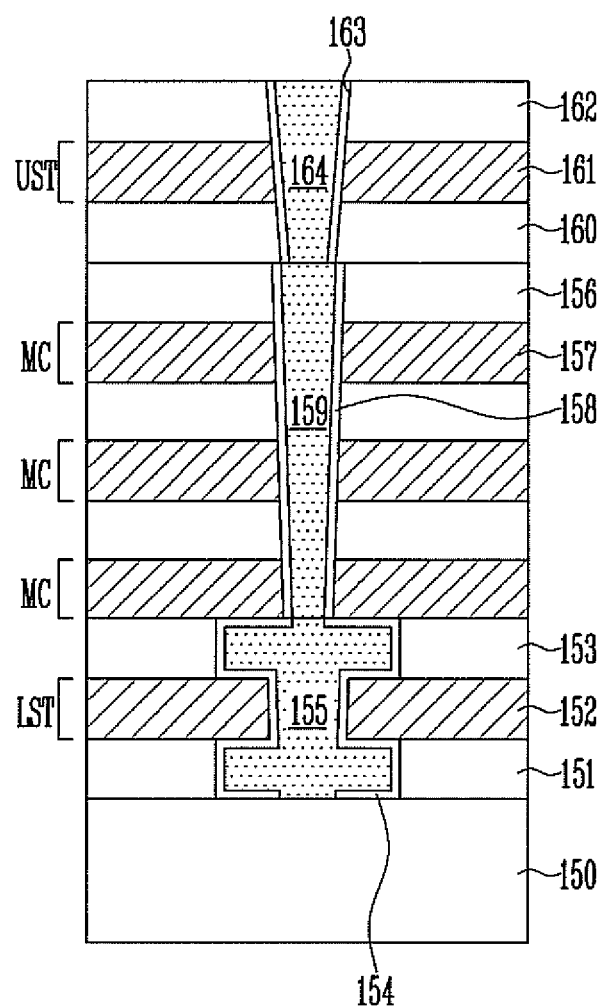
FIG. 11A and FIG. 11B each show a cross-sectional view illustrating a method of manufacturing a 3-D non-volatile memory device according to a fifth embodiment of this disclosure.
Figure 11B:
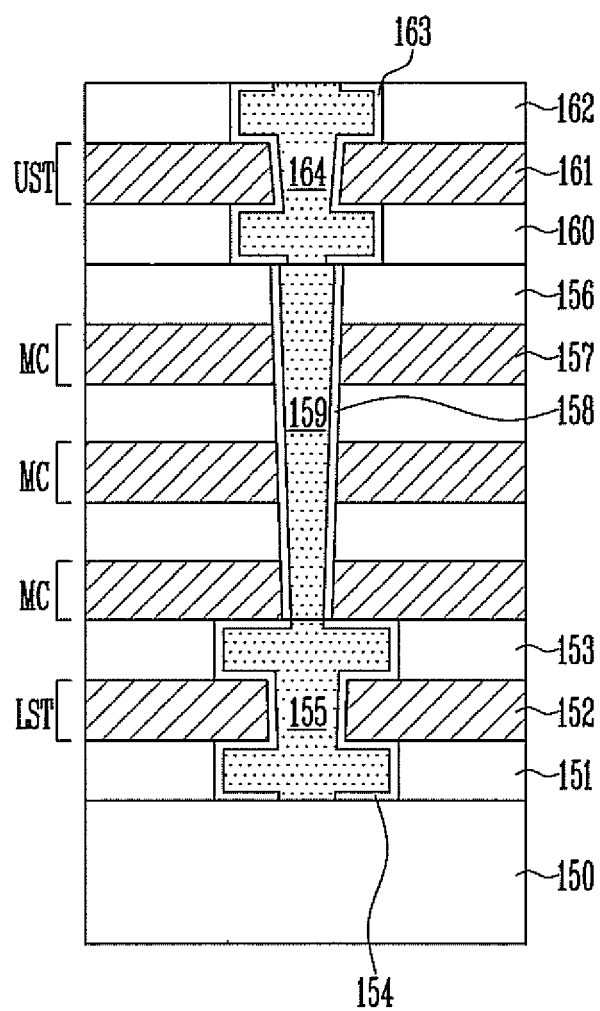

FIG. 11A and FIG. 11B each show a cross-sectional view illustrating a method of manufacturing a 3-D non-volatile memory device according to a fifth embodiment of this disclosure. In particular, FIG. 11A and FIG. 11B each show a cross-sectional view of a vertical channel-type non-volatile memory device.

A first interlayer dielectric layer 151, a first conductive layer 152, and a second interlayer dielectric layer 153 are sequentially formed over a substrate 150 in which a source line (not shown but located below the first interlayer dielectric layer 151 and for being coupled to the channel layer 155) is included and subsequently etched to form a trench for a channel. The first interlayer dielectric layer 151 and the second interlayer dielectric layer 153, exposed to the inner wall of the trench, are recessed to a desired thickness, so that a trench for a channel, including recess regions in which the first interlayer dielectric layer 151 and the second interlayer dielectric layer 153 are selectively recessed, is formed.

A gate insulating layer 154 is formed along the inner surface of the trench including the recess regions. Next, an etch-back process for exposing substrate 150 at the bottom of the trench is performed. Next, a layer 155 for a channel is buried in the trench to form the channel of a lower select transistor LST. Here, the upper and lower protrusions of the channel of the lower select transistor LST, buried in the recess regions, surround the conductive layer 152 (that is, the top and bottom corners of a gate electrode).

A plurality of interlayer dielectric layers 156 and a plurality of conductive layers 157 are alternately formed over the resulting structure in which the lower select transistor LST is formed. The plurality of interlayer dielectric layers 156 and the plurality of conductive layers 157 are etched to form a first trench through which the channel of the lower select transistor LST is exposed. A charge blocking layer, a charge trap layer, and a tunnel insulating layer 158 are sequentially formed over the inner wall of the first trench. Next, a layer 159 for a channel is buried in the first trench. Accordingly, a plurality of memory cells MC are stacked and formed along the channel protruded from the substrate 150.

A sacrificial layer (for example, a nitride layer) may be formed instead of the conductive layer 157. In this case, after the charge blocking layer, the charge trap layer, the tunnel insulating layer, and the channel are formed, the sacrificial layer may be removed and control gate electrodes may be subsequently formed.

A third interlayer dielectric layer 160, a second conductive layer 161, and a fourth interlayer dielectric layer 162 are sequentially formed over the resulting structure in which the plurality of memory cells MC are formed and subsequently etched to form a trench for a channel. After a gate insulating layer 163 is formed on the inner wall of the trench, a layer 164 for a channel is formed within the trench for a channel as shown in FIG. 11A. Alternatively, in FIG. 11B, the third and fourth interlayer dielectric layers 160 and 162 are recessed by using a mask pattern on the fourth interlayer dielectric layer 162 and etching the fourth interlayer dielectric layer 162 using the mask pattern and subsequently recessing the fourth interlayer dielectric layer 162 (that is, in the same manner that the first and second dielectric layers 151 and 153 are recessed). In either way, an upper select transistor UST is formed. Here, the insulating layers 163, 158, 154 may be formed separately or formed at one time simultaneously by forming an insulating layer on the combined, unitary channel through the corresponding layers. Similarly, the channels 164, 159, and 155 may be formed separately or formed at one time by forming a channel layer on the combined, unitary trench through the corresponding layers. Here, the third and fourth interlayer dielectric layers 160 and 162 may be recessed separately or at the same time.

In the fifth embodiment, the method of forming the channel having an uneven structure using the first embodiment has been described, but this is only for illustration purposes and this disclosure is not limited thereto. The method of forming the channel having an uneven structure according to the second embodiment may also be applied to the method according to the fifth embodiment.

Furthermore, an example in which the channel has an uneven structure for, for example, only the lower select transistor LST has been described. However, for example, the channel may have an uneven structure for only the upper select transistor UST or may have an uneven structure for both the upper select transistor UST and the lower select transistor LST.

FIGS. 12A to 12H are cross-sectional views illustrating a method of manufacturing a 3-D non-volatile memory device according to a sixth embodiment of this disclosure. In the manufacturing method according to the sixth embodiment, a plurality of interlayer dielectric layers and a plurality of sacrificial layers are alternately stacked to form a U-shaped trench, and the final non-volatile memory device has substantially the same structure as the non-volatile memory device according to the first embodiment.

Figure 12A:
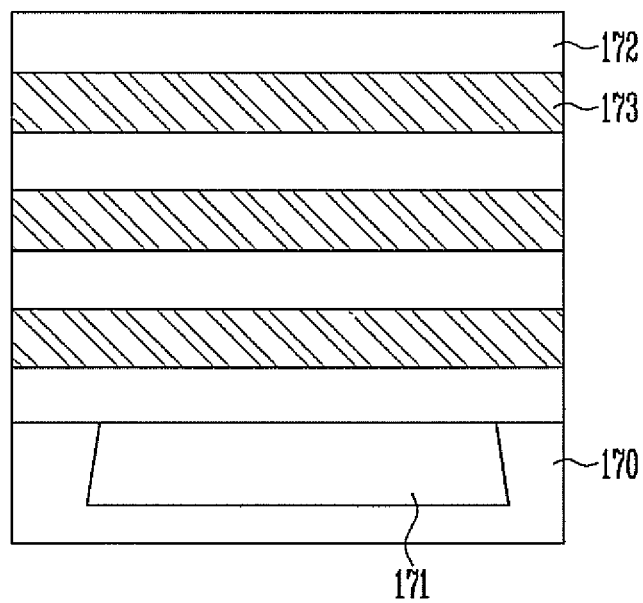
FIGS. 12A to 12H are cross-sectional views illustrating a method of manufacturing a 3-D non-volatile memory device according to a sixth embodiment of this disclosure.

As shown in FIG. 12A, a pipe gate 170 is etched to form a first trench, and the first trench is filled with a first sacrificial layer 171. The first sacrificial layer 171 may be an oxide layer or a nitride layer.

A plurality of first material layers and a plurality of second material layers 173 are alternately formed over the resulting structure in which the first sacrificial layer 71 is filled.

For example, first material layers may be sacrificial layers, such as undoped polysilicon layers or undoped amorphous silicon layers, and second material layers may be conductive layers for the word lines, such as doped polysilicon layers or doped amorphous silicon layers. Here, the term 'doped' means that impurities, such as boron (B) have been doped, and the term 'undoped' means that impurities have not been doped.

For another example, first material layers may be the interlayer dielectric layers such as an oxide layers, and second material layers may be sacrificial layers such as nitride layers.

In the sixth embodiment, it is hereinafter assumed that the first material layer is an interlayer dielectric layer 172 and the second material layer is a second sacrificial layer 173. In some embodiments, the interlayer dielectric layer 172 may be formed of a nitride layer and the second sacrificial layer 173 may be formed of an oxide layer.

Figure 12B:
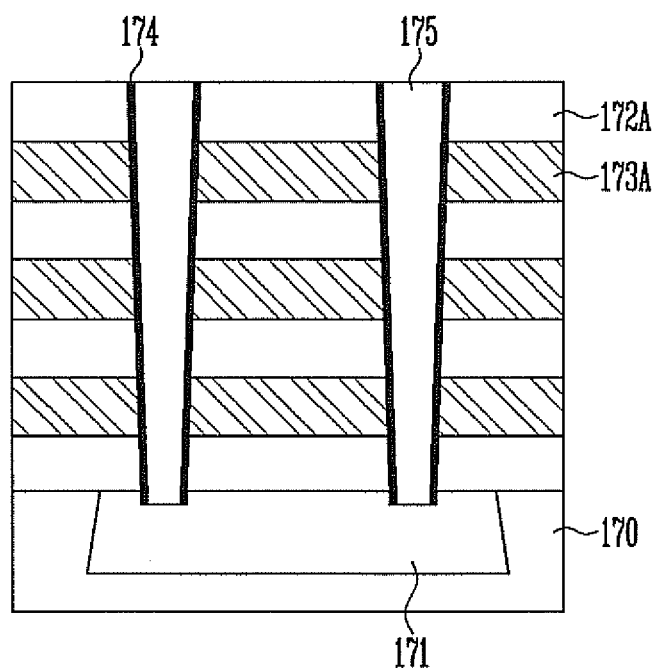

As shown in FIG. 12B, the plurality of interlayer dielectric layers 172 and the plurality of second sacrificial layers 173 are etched to form a pair of second trenches coupled to the first trench.

A first protection layer 174 is formed on the inner walls of the second trenches. For example, the first protection layer 174 may be formed by forming a layer for protection material on the entire surface of the resulting structure in which the second trenches are formed and subsequently performing a dry etch process so that the layer for protection material remains, for example, only on the inner walls of the second trenches. According to an example, the first protection layer 174 be made of material having a greater etch selectivity than the first sacrificial layer 171, the interlayer dielectric layer 172, the second sacrificial layer 173, and a third sacrificial layer to be formed in a subsequent process. For example, the first protection layer 174 may be formed of a TiN layer.

A third sacrificial layer 175 is buried in the second trenches in which the first protection layer 174 is formed. The third sacrificial layer 175 may be an oxide layer or a nitride layer.

Figure 12C:
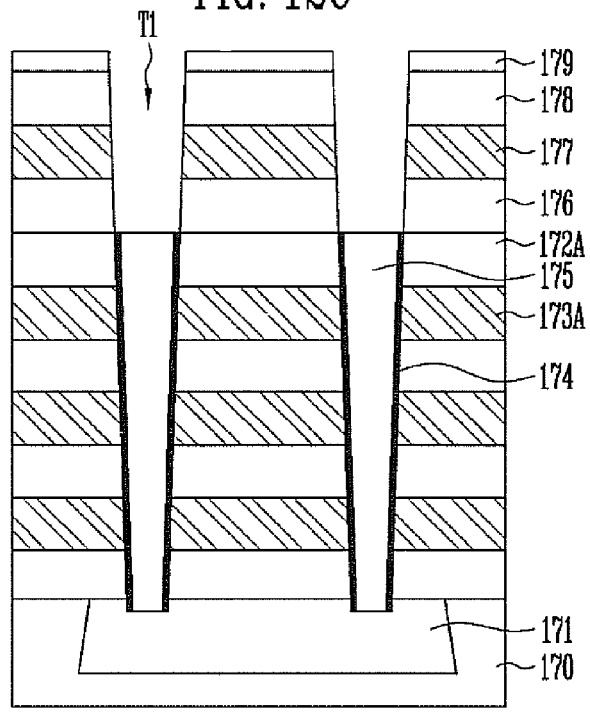

As shown in FIG. 12C, a first interlayer dielectric layer 176, a fourth sacrificial layer 177, and a second interlayer dielectric layer 178 are formed over the resulting structure in which the third sacrificial layer 175 is buried. A mask pattern 179 is formed on the second interlayer dielectric layer 178. The mask pattern 179 may be a nitride layer. Furthermore, the fourth sacrificial layer 177 may be made of the same material as a second sacrificial layer 172A.

The second interlayer dielectric layer 178, the fourth sacrificial layer 177, and the first interlayer dielectric layer 176 are etched using the mask pattern 179 as an etch barrier, thereby forming trenches T1 for channels through which a surface of the third sacrificial layer 175 is exposed.

Figure 12D:
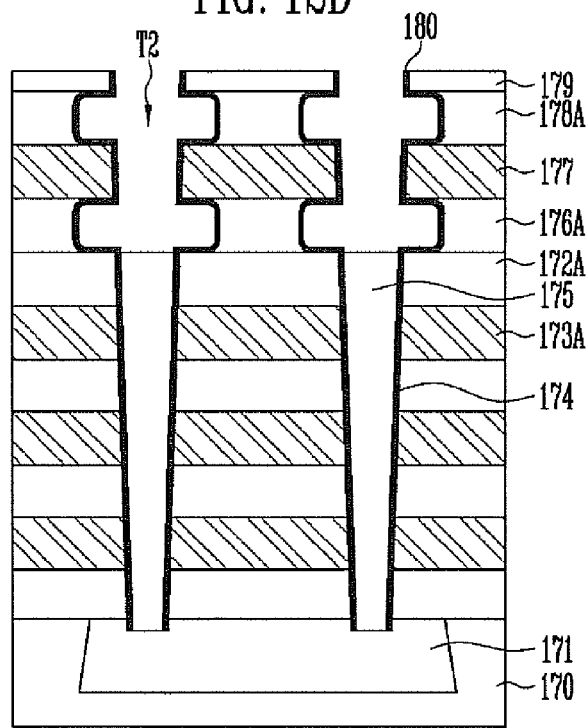

As shown in FIG. 12D, the first interlayer dielectric layer 176 and the second interlayer dielectric layer 178, exposed to the inner walls of the trenches T1, are recessed to a desired thickness, thereby forming trenches T2 for channels including the recess regions. In this figure, the first interlayer dielectric layer recessed to a desired thickness is assigned reference numeral '176A', and the second interlayer dielectric layer recessed to a desired thickness is assigned reference numeral '178A'.

A second protection layer 180 is formed on the inner walls of the trenches T2. The second protection layer 180 may be made of the same material as the first protection layer 174.

Figure 12E:
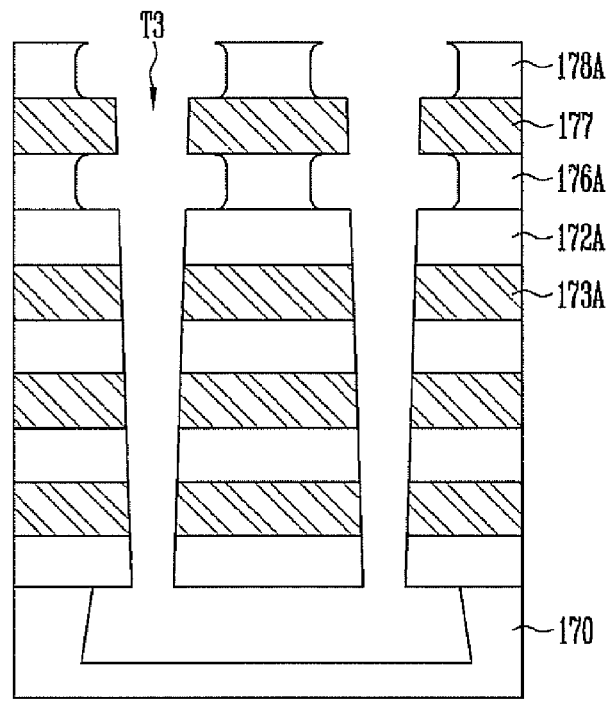

As shown in FIG. 12E, the third sacrificial layer 175 and the first sacrificial layer 171, exposed at the bottoms of the trenches T2, are removed to form a trench T3 for a U-shaped channel. Here, for example, only the first sacrificial layer 171 and the third sacrificial layer 175 may be selectively removed by means of the first protection layer 174 and the second protection layer 180 which are formed on the inner walls of the trenches T2.

Next, the first protection layer 174 and the second protection layer 180 remaining on the inner wall of the trench T3 are removed. For example, the first protection layer 174 and the second protection layer 180 may be removed using a strip process.

Figure 12F:
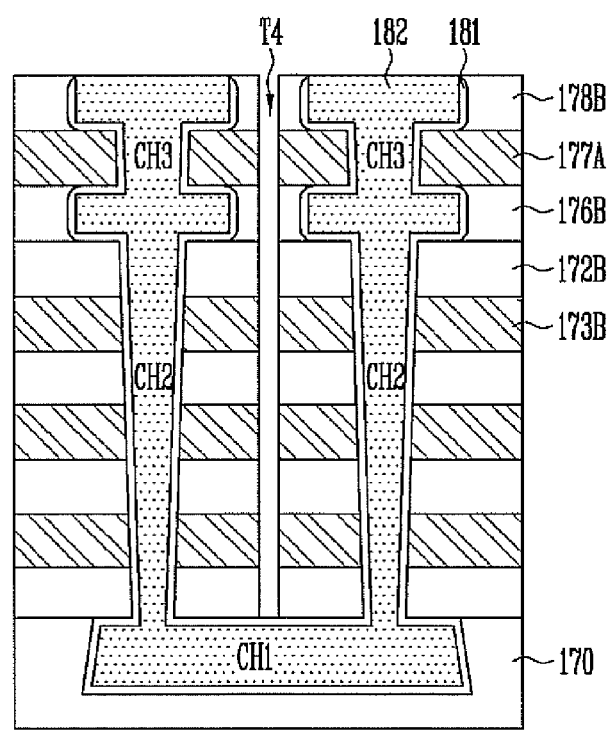

As shown in FIG. 12F, a charge blocking layer, a charge trap layer, and a tunnel insulating layer 181 are sequentially formed over the inner wall of the trench T3. Next, a layer 182 for channels is formed on the entire surface to fill the trench 13. Next, a polishing process is performed until a surface of the second interlayer dielectric layer 178A is exposed, thereby forming the U-shaped channel.

Next, the second interlayer dielectric layer 178A, the fourth sacrificial layer 177, the first interlayer dielectric layer 176A, the plurality of interlayer dielectric layers 172A, and the plurality of second sacrificial layers 173A within the U-shaped channel are etched to form a slit T4 for removing the sacrificial layers. The slit T4. According to an example, the slit T4 may be formed to a depth of the extent that all the fourth sacrificial layer 177 and the plurality of second sacrificial layers 173A can be exposed.

In this figure, the etched second interlayer dielectric layer is assigned reference numeral '178B', the etched fourth sacrificial layer is assigned reference numeral '177A', the etched first interlayer dielectric layer is assigned reference numeral '176B', the plurality of etched interlayer dielectric layers is assigned reference numeral '172B', and the plurality of etched second sacrificial layers is assigned reference numeral '173B'.

Figure 12G:
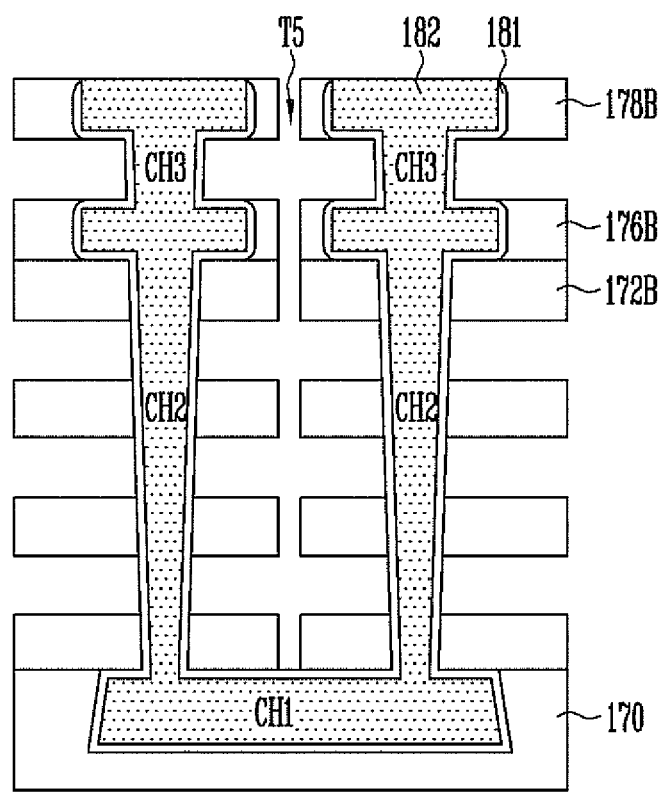

As shown in FIG. 12G, the fourth sacrificial layer 177A and the plurality of second sacrificial layers 173B, exposed on the inner wall of the slit T4, are removed. The regions from which the second sacrificial layers 173b have been removed is called 'word line regions' because word lines are formed in a subsequent process, and the regions from which the fourth sacrificial layer 177a has been removed are called 'select line regions' because select lines are formed in a subsequent process. In this figure, the slit for removing the sacrificial layers, extended by the word line regions and the select line region, is assigned reference numeral 'T5'.

Figure 12H:
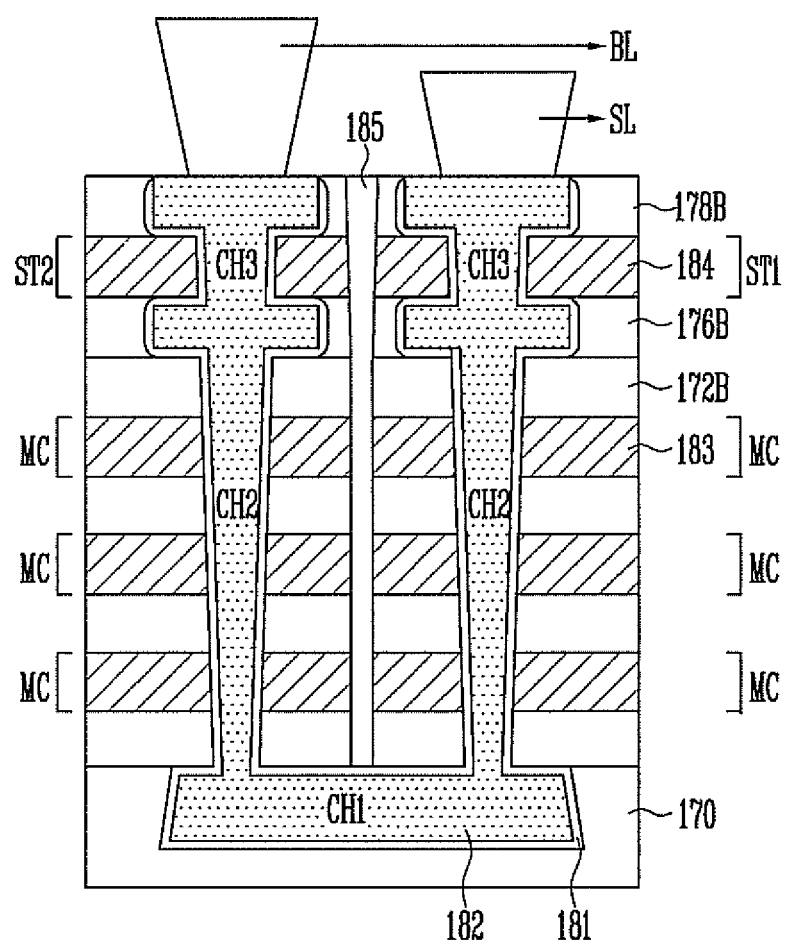

As shown in FIG. 12H, the plurality of word line regions and the plurality of select line regions are filled with a conductive layer to form a plurality of word lines 183 and a plurality of select lines 184. For example, the plurality of word lines 183 and the plurality of select lines 184 may be formed by filling the slit T5 with the conductive layer and subsequently performing an etch-back process. The conductive layer may be a metal layer.

An insulating layer 185 is buried in the trench in which the plurality of word lines 183 and the plurality of select lines 184 are formed.

Next, a source line SL is formed and coupled to the channel CH3 of a first select transistor ST1 formed over a memory cell MC on one side, from among a plurality of memory cells MC stacked in a U shape. A bit line BL is formed and coupled to the channel CH3 of a second select transistor ST2 formed over a memory cell MC on the other side, from among the plurality of memory cells MC stacked in a U shape.

Meanwhile, as described above, the first material layers may be sacrificial layers and the second material layers may be conductive layers. In this case, the first material layers are removed after forming slit, and insulating layers are formed in regions formed by removing the first material layers.

Furthermore, in the sixth embodiment, an example in which the plurality of memory cells MC, the first select transistor ST1, and the second select transistor ST2 are formed using the sacrificial layers has been described. However, according to another example, only some of the sacrificial layers may be used. For example, the plurality of memory cells MC may be formed using the sacrificial layer as described above with reference to the sixth embodiment, and the first select transistor ST1 and the second select transistor ST2 may be formed using the conductive layer as described above with reference to the first embodiment and the second embodiment. That is, the first embodiment to the sixth embodiment may be combined and implemented.

The exemplary embodiments may provide the 3-D non-volatile memory device including the select transistors, each having the protrusion of the channel surrounds the corners of the gate electrode. In other words, there may be provided the 3-D non-volatile memory device including the select transistors having a gate surrounded structure, in which the gate electrode protrudes into the channel and surrounds the entire surface of the channel.

As described above, since the upper or lower portion of the channel of the select transistor protrudes and surrounds the top or bottom corner of the gate electrode, the joining surface of the gate electrode and the channel of the select transistor may have unevenness. Accordingly, GIDL can be easily generated by energy band bending because an electric field is concentrated on the corners of the gate electrode protruded into the channel. Accordingly, a condition that GIDL is generated using an intrinsic channel can sufficiently satisfied without forming a channel doped with N type impurities of a high concentration or without supplying a high voltage to a bit line or a source line. Furthermore, the contact area with a bit line or a source line can be sufficiently secured because the upper portion of the channel of the select transistor protrudes and the upper area of the channel increases.

In accordance with this disclosure, the threshold voltages of memory cells can be sufficiently shifted in a program or erase operation. That is, a program-erase window of 8 V or higher can be secured. Accordingly, the erase speed of the 3-D non-volatile memory device can be improved, and so Multi-Level Cell (MLC) driving may be implemented.

What is claimed is:

1. A non-volatile memory device, comprising:
    a plurality of memory cells stacked along a channel protruded from a substrate;
    a first select transistor connected to one end of the plurality of memory cells;
    a first interlayer dielectric layer for being coupled between a source line and the first select transistor; and
    a second interlayer dielectric layer disposed between the first select transistor and the one end of the plurality of memory cells, and configured to include a first recess region.

2. The non-volatile memory device of claim 1, wherein the first interlayer dielectric layer comprises a second recess region.

3. The non-volatile memory device of claim 1, further comprising:
    a second select transistor connected to the other end of the plurality of memory cells;
    a third interlayer dielectric layer disposed between the second select transistor and the other end of the plurality of memory cells; and
    a fourth interlayer dielectric layer for being coupled between the second select transistor and a bit line, and configured to include a third recess region.

4. The non-volatile memory device of claim 3, wherein the third interlayer dielectric layer comprises a fourth recess region.

5. The non-volatile memory device of claim 1, further comprising an insulating layer buried at a center of the channel.

6. The non-volatile memory device of claim 1, wherein the channel is a U-shaped channel including a first channel that is buried in a pipe gate and a pair of second channels coupled to the first channel.

* * * * *